United States Patent
Baek et al.

(10) Patent No.: US 9,431,383 B2
(45) Date of Patent: Aug. 30, 2016

(54) INTEGRATED CIRCUIT, SEMICONDUCTOR DEVICE BASED ON INTEGRATED CIRCUIT, AND STANDARD CELL LIBRARY

(71) Applicants: Sang-hoon Baek, Seoul (KR);
Sang-kyu Oh, Gwacheon-si (KR);
Jung-ho Do, Yongin-si (KR);
Sun-young Park, Seoul (KR);
Seung-young Lee, Incheon (KR);
Hyo-sig Won, Suwon-si (KR)

(72) Inventors: Sang-hoon Baek, Seoul (KR);
Sang-kyu Oh, Gwacheon-si (KR);
Jung-ho Do, Yongin-si (KR);
Sun-young Park, Seoul (KR);
Seung-young Lee, Incheon (KR);
Hyo-sig Won, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/801,121

(22) Filed: Jul. 16, 2015

(65) Prior Publication Data

US 2016/0027769 A1    Jan. 28, 2016

Related U.S. Application Data

(60) Provisional application No. 62/027,401, filed on Jul. 22, 2014.

(30) Foreign Application Priority Data

Jan. 9, 2015  (KR) .................. 10-2015-0003466

(51) Int. Cl.
| | | |
|---|---|---|
| *H01L 21/70* | (2006.01) | |
| *H01L 27/02* | (2006.01) | |
| *H01L 27/092* | (2006.01) | |
| *H01L 29/423* | (2006.01) | |
| *H01L 29/78* | (2006.01) | |
| *H01L 27/118* | (2006.01) | |

(52) U.S. Cl.
CPC ....... *H01L 27/0207* (2013.01); *H01L 27/0924* (2013.01); *H01L 27/11807* (2013.01); *H01L 29/42384* (2013.01); *H01L 29/785* (2013.01)

(58) Field of Classification Search
CPC .................................................. H01L 27/0207
USPC ........................................................ 257/369
See application file for complete search history.

(56) References Cited

U.S. PATENT DOCUMENTS

| | | | |
|---|---|---|---|
| 6,662,350 | B2 | 12/2003 | Fried et al. |
| 6,943,405 | B2 | 9/2005 | Bryant et al. |
| 7,315,994 | B2 | 1/2008 | Aller et al. |
| 7,517,806 | B2 | 4/2009 | Bryant et al. |
| 7,737,501 | B2 | 6/2010 | Zhu et al. |
| 7,812,373 | B2 | 10/2010 | Bauer et al. |

(Continued)

FOREIGN PATENT DOCUMENTS

| | | | |
|---|---|---|---|
| JP | 4056398 B2 | 3/2008 | |
| JP | 5041808 B2 | 10/2012 | |

(Continued)

*Primary Examiner* — Anthony Ho
(74) *Attorney, Agent, or Firm* — Harness, Dickey & Pierce, P.L.C.

(57) ABSTRACT

An integrated circuit (IC) may include at least one cell including a plurality of conductive lines that extend in a first direction and are in parallel to each other in a second direction that is perpendicular to the first direction, first contacts respectively disposed at two sides of at least one conductive line from among the plurality of conductive lines, and a second contact disposed on the at least one conductive line and the first contacts and forming a single node by being electrically connected to the at least one conductive line and the first contacts.

21 Claims, 21 Drawing Sheets

(56) References Cited

U.S. PATENT DOCUMENTS

| | | |
|---|---|---|
| 8,026,138 B2 | 9/2011 | Lee |
| 8,561,003 B2 | 10/2013 | Kawa et al. |
| 8,595,661 B2 | 11/2013 | Kawa et al. |
| 8,847,361 B2 | 9/2014 | Liaw et al. |
| 2008/0169487 A1 | 7/2008 | Shimbo et al. |
| 2010/0127333 A1 | 5/2010 | Hou et al. |
| 2010/0287518 A1 | 11/2010 | Becker |
| 2011/0195564 A1 | 8/2011 | Liaw et al. |

FOREIGN PATENT DOCUMENTS

| | | |
|---|---|---|
| KR | 10-0702552 B1 | 4/2007 |
| KR | 10-0990599 B1 | 10/2010 |
| KR | 10-1022250 B1 | 3/2011 |
| KR | 10-1087864 B1 | 11/2011 |
| KR | 10-1291574 B1 | 8/2013 |

FIG. 4
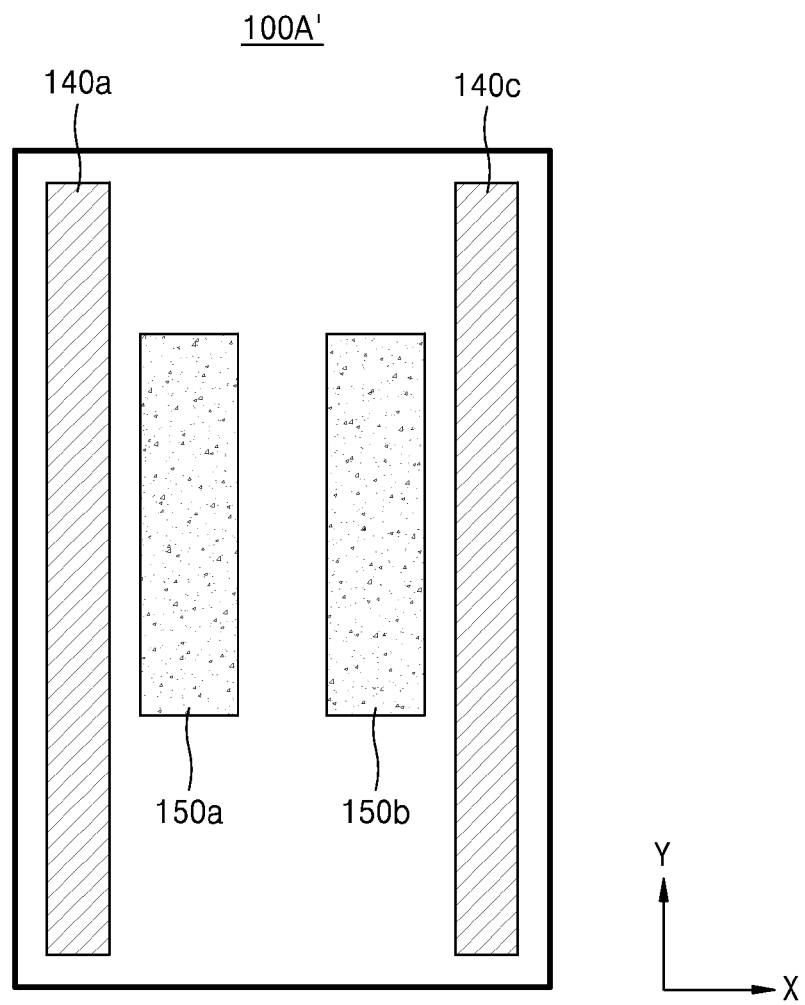
 : CELL BOUNDARY

INTEGRATED CIRCUIT, SEMICONDUCTOR DEVICE BASED ON INTEGRATED CIRCUIT, AND STANDARD CELL LIBRARY

CROSS-REFERENCE TO RELATED APPLICATION

This application claims the benefit of U.S. Patent Application No. 62/027,401, filed on Jul. 22, 2014, in the U.S. Patent and Trademark Office, and Korean Patent Application No. 10-2015-0003466, filed on Jan. 9, 2015, in the Korean Intellectual Property Office, the disclosures of both of which are incorporated herein in their entirety by reference.

BACKGROUND

Example embodiments of the inventive concepts relate to an integrated circuit (IC) including at least one cell, a semiconductor device based on the IC, and/or a standard cell library that stores information about same.

As the size of transistors is reduced and semiconductor manufacturing technology further develops, more transistors may be integrated in semiconductor devices. For example, a system-on-chip (SOC), which refers to an integrated circuit (IC) that integrates all components of a computer or other electronic system into a single chip, is used in various applications. The increasing performance demands of applications may demand semiconductor devices that include more components.

SUMMARY

According to at least one example embodiment of the inventive concepts, an integrated circuit (IC) may include at least one cell, the at least one including a plurality of conductive lines that extend in a first direction and are disposed in parallel to each other in a second direction that is perpendicular to the first direction, first contacts respectively disposed at two sides of at least one conductive line from among the plurality of conductive lines, and a second contact disposed on the at least one conductive line and the first contacts, and forming a single node by being electrically connected to the at least one conductive line and the first contacts.

According to other example embodiments of the inventive concepts, a semiconductor device may include a substrate including first and second active regions having different conductive types, a plurality of conductive lines that extend in a first direction and are disposed in parallel to each other in a second direction that is perpendicular to the first direction, first contacts respectively disposed at two sides of at least one conductive line from among the plurality of conductive lines, and a second contact disposed on the at least one conductive line and the first contacts in at least one of the first and second active regions, and forming a single node by being electrically connected to the at least one conductive line and the first contacts.

According to other example embodiments of the inventive concepts, a standard cell library stored in a non-transitory computer-readable storage medium may include information about a plurality of standard cells. At least one of the plurality of standard cells includes first and second active regions having different conductive types, a plurality of fins disposed in parallel to each other in the first and second active regions, a plurality of conductive lines that extend in a first direction and are disposed in parallel to each other in a second direction that is perpendicular to the first direction, above the plurality of fins, first contacts respectively disposed at two sides of at least one conductive line from among the plurality of conductive lines, and a second contact forming a single node by being electrically connected to the at least one conductive line and the first contacts in at least one of the first and second active regions.

According to other example embodiments, a semiconductor device may include a substrate including a first active region having a first conductive type and a second active region having a second conductive type different from the first conductive type; a plurality of gate electrodes extending in a first direction such that the plurality of gate electrodes are parallel to each other in a second direction, the second direction being perpendicular to the first direction; first contacts at a respective one of two sides of a skipped gate electrode of the plurality of gate electrodes, the skipped gate electrode being one of the plurality of gate electrodes whose electrode is connected to the first contacts; and a second contact electrically connected to the skipped gate electrode and the first contacts in the first active region such that the second contact, the at least one conductive line and the first contacts form a single node in the first active region.

BRIEF DESCRIPTION OF THE DRAWINGS

Example embodiments of the inventive concepts will be more clearly understood from the following detailed description taken in conjunction with the accompanying drawings in which:

FIG. 4 is a layout illustrating a portion of an IC that is substantially the same as the example embodiment of FIG. 1;

DETAILED DESCRIPTION

Figure 1:
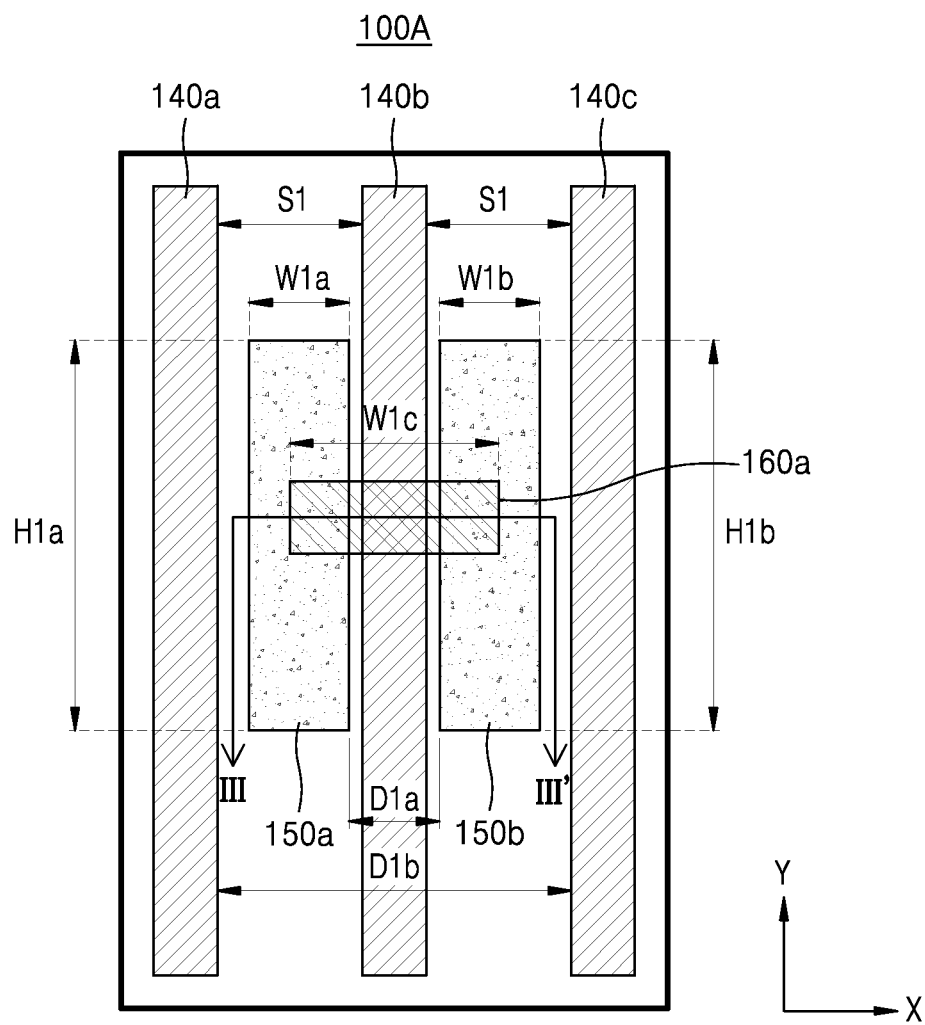
FIG. 1 is a layout illustrating a portion of an integrated circuit (IC) according to an example embodiment.

Reference will now be made in detail to example embodiments, some examples of which are illustrated in the accompanying drawings, wherein like reference numerals refer to like elements throughout. These example embodiments are provided so that this disclosure will be thorough and complete, and will fully convey the present inventive concept to those of ordinary skill in the art. As the inventive concepts allow for various changes and numerous example embodiments, particular example embodiments will be illustrated in the drawings and described in detail in the written description. However, this is not intended to limit the inventive concepts to particular modes of practice, and it is to be appreciated that all changes, equivalents, and substitutes that do not depart from the spirit and technical scope are encompassed in the inventive concepts. Sizes of components in the drawings may be exaggerated for convenience of explanation. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe particular example embodiments, and are not intended to limit the inventive concepts. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, within the scope of the inventive concepts, a first component may be referred to as a second component, and vice versa.

Unless defined otherwise, all terms used in the description including technical or scientific terms have the same meaning as commonly understood by one of ordinary skill in the art to which the example embodiments of the inventive concepts pertain. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification.

FIG. 1 is a layout illustrating a portion of an integrated circuit (IC) 100A according to an example embodiment.

Referring to FIG. 1, the IC 100A may include at least one cell defined by a cell boundary indicated with a bold line. The cell may include first to third conductive lines 140a to 140c, first contacts 150a and 150b, and a second contact 160a. Although not illustrated, a plurality of conductive lines, for example, metal lines, may be additionally disposed at an upper portion of the cell.

According to some example embodiments, the cell may be a standard cell. According to a method of designing a standard cell layout, repeatedly used devices such as OR gates or AND gates are designed as standard cells in advance and stored in a computer system, and during a layout design process, the standard cells are disposed in necessary locations and wired. Thus, a layout may be designed in a relatively short time.

The first to third conductive lines 140a to 140c may extend in a first direction (e.g., Y direction). Also, the first to third conductive lines 140a to 140c may be disposed in parallel to each other in a second direction (e.g., X direction) that is substantially perpendicular to the first direction. The first to third conductive lines 140a to 140c may be formed of a material having electric conductivity, for example, polysilicon, metal, and metal alloy.

According to an example embodiment, the first to third conductive lines 140a to 140c may correspond to gate electrodes. However, example embodiments are not limited thereto, for example, and the first to third conductive lines 140a to 140c may be conductive traces. Also, although FIG. 1 illustrates that the cell includes the first to third conductive lines 140a to 140c, example embodiments are not limited thereto. For example, the cell may include four or more conductive lines that extend in the first direction and are parallel to each other in the second direction.

The first contacts 150a and 150b may extend in the first direction. Also, the first contacts 150a and 150b may be disposed in parallel to each other in the second direction that is substantially perpendicular to the first direction. The first contacts 150a and 150b may be formed of a material having electric conductivity, for example, polysilicon, metal, and metal alloy. Accordingly, the first contacts 150a and 150b may provide a power voltage or a ground voltage to lower areas between the first to third conductive lines 140a to 140c.

According to some example embodiments, the first contacts 150a and 150b may respectively be disposed at two sides of the second conductive line 140b. Specifically, the first contacts 150a and 150b may include a first left contact 150a disposed at a left side of the second conductive line 140b and a first right contact 150b disposed at a right side of the second conductive line 140b. In other words, the first left contact 150a may be disposed between the first and second conductive lines 140a and 140b, and the first right contact 150b may be disposed between the second and third conductive lines 140b and 140c.

According to some example embodiments, a length of the first left contact 150a in the second direction, that is, a width W1a may be smaller than a space 51 between the first and second conductive lines 140a and 140b. Likewise, a length of the first right contact 150b in the second direction, that is, a width W1*b* may be smaller than a space 51 between the second and third conductive lines 140*b* and 140*c*. According to an example embodiment, the width W1*a* of the first left contact 150*a* and the width W1*b* of the first right contact 150*b* may be substantially the same. However, example embodiments are not limited thereto. For example, according to another example embodiment, the width W1*a* of the first left contact 150*a* may be different from the width W1*b* of the first right contact 150*b*.

The second contact 160*a* may be disposed on the second conductive line 140*b* and the first contacts 150*a* and 150*b*, and may form a single node by being electrically connected to the second conductive line 140*b* and the first contacts 150*a* and 150*b*. Also, the second contact 160*a* may extend in the second direction, and accordingly, the second contact 160*a* may be disposed in a direction that horizontally crosses the second conductive line 140*b* and the first contacts 150*a* and 150*b*. The second contact 160*a* may be formed of a material having electric conductivity, for example, polysilicon, metal, and metal alloy. Accordingly, the second contact 160*a* may provide, for example, an identical power voltage or an identical ground voltage to the second conductive line 140*b* and the first contacts 150*a* and 150*b*.

According to some example embodiments, a length of the second contact 160*a* in the second direction, that is, a width W1*c* may be larger than a distance D1*a* between the first left contact 150*a* and the first right contact 150*b* and smaller than a distance D1*b* between the first and third conductive lines 140*a* and 140*c*. Accordingly, the second contact 160*a* may be electrically connected to the second conductive line 140*b*, the first left contact 150*a*, and the first right contact 150*b*, but not to the first and third conductive lines 140*a* and 140*c*.

According to some example embodiments, a length of the first left contact 150*a* in the first direction, that is, a height H1*a*, may be the same as a length of the first right contact 150*b* in the first direction, that is, a height H1*b*. Accordingly, the first left contact 150*a*, the first right contact 150*b*, and the second contact 160*a* may form an H-shaped jumper. A jumper is a conducting wire having a relatively short length for connecting two points or two terminals in the IC 100A.

As described above, according to some example embodiments, a single node may be formed by electrically connecting the second conductive line 140*b*, the first contacts 150*a* and 150*b*, and the second contact 160*a*. Therefore, in the IC 100A manufactured based on the layout shown in FIG. 1, the second conductive line 140*b* may be skipped or screened. Thus, the H-shaped jumper according to some example embodiments may be referred to as a skip device.

According to some example embodiments, a cell in which the second conductive line 140*b* is skipped may be designed by electrically connecting the second conductive line 140*b*, the first contacts 150*a* and 150*b*, and the second contact 160*a*. Therefore, the first contacts 150*a* and 150*b* and the second contact 160*a* may be separated from the second conductive line 140*b* to reduce (or, alternatively, eliminate) the possibility of an electric short occurring when a jumper is formed.

Information about the above-described layout of the standard cell may be stored in a standard cell library. Specifically, the standard cell library may include information about a plurality of standard cells, and be stored in a computer-readable storage medium. For example, a non-transitory computer-readable storage medium. A standard cell corresponding to the information included in the standard cell library refers to a unit of an IC having a size that satisfies a standard. For example, a height (e.g., a length in the Y direction of FIG. 1) of a layout of the standard cell may be fixed, and a width (e.g., a length in the X direction of FIG. 1) of the standard cell may vary according to standard cells. The standard cell may include an input fin for processing input signals and an output fin for outputting output signals.

An IC may be a plurality of standard cells. An IC design tool may design the IC, that is, finish a layout of the IC by using the standard cell library that includes information about the plurality of standard cells. The IC design tool may place a via on a pin (i.e., an input pin and an output pin) included in a standard cell so that the pin is connected with a pattern on a layer formed after the pin of the standard cell is formed in a semiconductor manufacturing process. That is, by placing the via in the pin of the standard cell, input signals or output signals of the standard cell may be transmitted.

Figure 2:
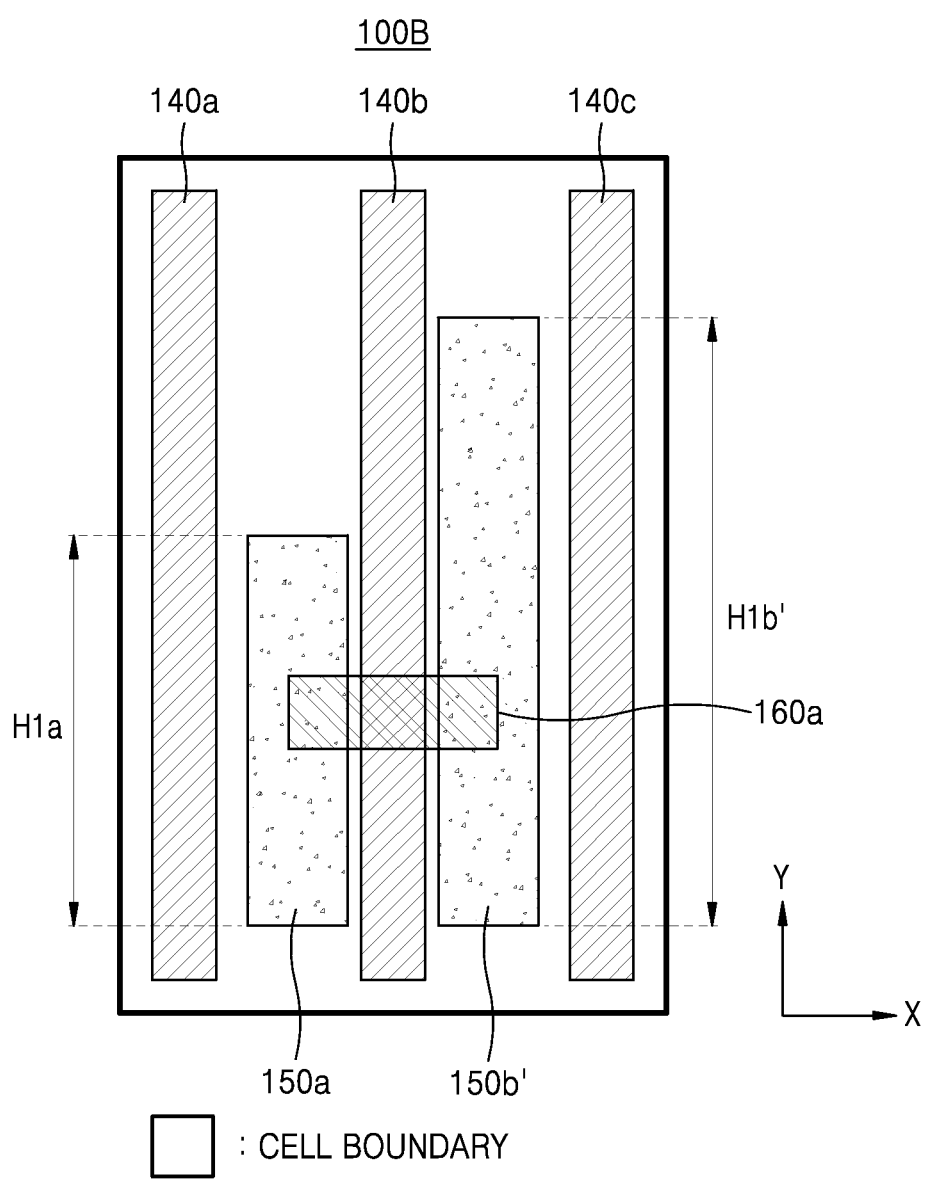
FIG. 2 is a layout illustrating a portion of an IC according to another example embodiment.

FIG. 2 is a layout illustrating a portion of an IC 100B according to other example embodiments.

Referring to FIG. 2, the IC 100B may include the first to third conductive lines 140*a* to 140*c*, the first left contact 150*a*, a first right contact 150*b'*, and the second contact 160*a*. The IC 100B is a modified example embodiment of the IC 100A shown in FIG. 1. Therefore, at least some of the descriptions of FIG. 1 may also be applied to the IC 100B, and, thus, features and elements already described with reference to FIG. 1 will not be repeated.

According to some example embodiments, a length of the first left contact 150*a* in the first direction, that is, the height H1*a* may be different from a length of the first right contact 150*b'*, that is, a height H1*b'*. Accordingly, the first left contact 150*a*, the first right contact 150*b'*, and the second contact 160*a* may form an L-shaped jumper.

According to some example embodiments, the height H1*b'* of the first right contact 150*b'* may be greater than the height H1*a* of the first left contact 150*a*. According to other example embodiments, the height H1*a* of the first left contact 150*a* may be greater than the height H1*b'* of the first right contact 150*b'*. The height H1*a* of the first left contact 150*a* and the height H1*b'* of the first right contact 150*b'* may vary in various example embodiments.

Figure 3:
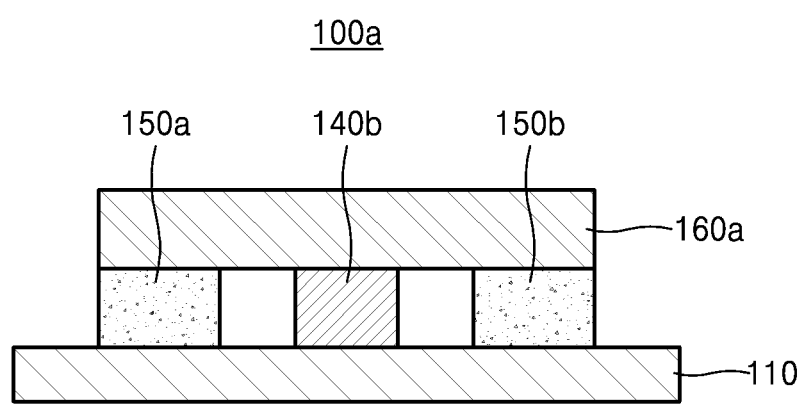
FIG. 3 is a cross-sectional view illustrating an example of a semiconductor device having the layout of FIG. 1, cut along line III-III' of FIG. 1.

FIG. 3 is a cross-sectional view illustrating an example of a semiconductor device 100*a* having the layout of FIG. 1, cut along line III-III' of FIG. 1.

Referring to FIG. 3, the semiconductor device 100*a* may include a substrate 110, the second conductive line 140*b*, the first contacts 150*a* and 150*b*, and the second contact 160*a*. Although not illustrated, a voltage terminal providing, for example, a power voltage or a ground voltage may be additionally disposed on the second contact 160*a*.

The substrate 110 may be a semiconductor substrate that includes any one selected from, for example, silicon, silicon-on-insulator (SOI), silicon-on-sapphire, germanium, silicon-germanium, and gallium-arsenide. For example, the substrate 110 may be a P-type substrate. Also, although not illustrated, the substrate 110 may have an active region that is doped with impurities.

The second conductive line 140*b* may be disposed on the substrate 110. According to some example embodiments, the second conductive line 140*b* may be used as a gate electrode. In this case, a gate insulating layer may be additionally disposed between the second conductive line 140*b* and the active region of the substrate 110.

The first contacts 150*a* and 150*b* may be disposed on the substrate 110. Therefore, the first contacts 150*a* and 150*b* may provide, for example, a power voltage or a ground voltage in the active region of the substrate 110. According to some example embodiments, the first contacts 150*a* and 150*b* may respectively be disposed at two sides of the second conductive line 140*b*. According to some example embodiments, upper portions of the first contacts 150*a* and 150*b* may be at a same level as an upper portion of the second conductive line 140*b*.

The second contact 160*a* may be disposed on the second conductive line 140*b* and the first contacts 150*a* and 150*b*, and form a single node by being electrically connected to the second conductive line 140*b* and the first contacts 150*a* and 150*b*.

FIG. 4 is a layout illustrating a portion of an IC 100A' that is substantially the same as the example embodiment of FIG. 1.

Referring to FIG. 4, the IC 100A' may include the first and third conductive lines 140*a* and 140*c* and the first contacts 150*a* and 150*b*. The first contacts 150*a* and 150*b* may be connected to a single metal line that is disposed at an upper portion. According to other example embodiments, the IC 100A' may include only one of the first contacts 150*a* and 150*b*.

The first contacts 150*a* and 150*b* and the second contact 160*a* in the layout shown in FIG. 1 form an H-shaped jumper. Therefore, when the IC 100A is actually manufactured, the IC 100A may be substantially the same as the IC 100A' that corresponds to the layout shown in FIG. 4. In other words, due to the H-shaped jumper in the layout shown in FIG. 1, the second conductive line 140*b* may be skipped.

Likewise, the first contacts 150*a* and 150*b*' and the second contact 160*a* in the layout shown in FIG. 2 may form an L-shaped jumper. Therefore, when the IC 100B is actually manufactured, the IC 100B may be substantially the same as the IC 100A' that corresponds to the layout shown in FIG. 4. In other words, due to the L-shaped jumper in the layout shown in FIG. 2, the second conductive line 140*b* may be skipped.

Figure 5:
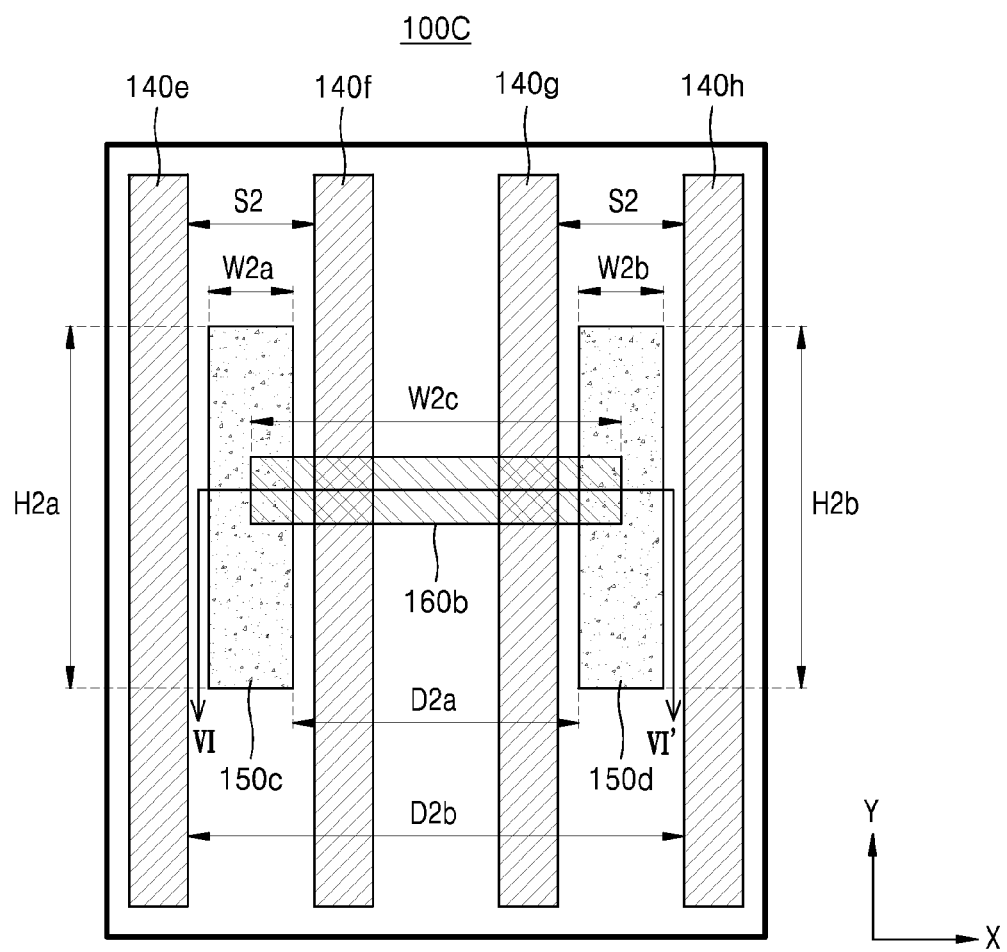
FIG. 5 is a layout illustrating a portion of an IC according to another example embodiment.

FIG. 5 is a layout illustrating a portion of an IC 100C according to other example embodiments.

Referring to FIG. 5, the IC 100C may include at least one cell defined by a cell boundary indicated with a bold line. The cell may include first to fourth conductive lines 140*e* to 140*h*, first contacts 150*c* and 150*d*, and a second contact 160*b*.

The first to fourth conductive lines 140*e* to 140*h* may extend in the first direction (e.g., the Y direction). Also, the first to fourth conductive lines 140*e* to 140*h* may be disposed in parallel to each other in the second direction (e.g., the X direction) that is substantially perpendicular to the first direction. The first to fourth conductive lines 140*e* to 140*h* may be formed of a material having electric conductivity, for example, polysilicon, metal, and/or metal alloy.

According to some example embodiments, the first to fourth conductive lines 140*e* to 140*h* may correspond to gate electrodes. However, example embodiments are not limited thereto. For example, the first to fourth conductive lines 140*e* to 140*h* may be conductive traces. Also, although FIG. 5 illustrates that the IC 100C includes the first to fourth conductive lines 140*e* to 140*h*, example embodiments are not limited thereto, for example, the IC 100C may include five or more conductive lines that extend in the first direction and are parallel to each other in the second direction.

The first contacts 150*c* and 150*d* may extend in the first direction. Also, the first contacts 150*c* and 150*d* may be disposed in parallel to each other in the second direction that is substantially perpendicular to the first direction. The first contacts 150*c* and 150*d* may be formed of a material having electric conductivity, for example, polysilicon, metal, and metal alloy. Accordingly, the first contacts 150*c* and 150*d* may provide a power voltage or a ground voltage to lower areas between the first to fourth conductive lines 140*e* to 140*h*.

According to some example embodiments, the first contacts 150*c* and 150*d* may include a first left contact 150*c* disposed at a left side of the second conductive line 140*f* and a first right contact 150*d* disposed at a right side of the third conductive line 140*g*. In other words, the first left contact 150*c* may be disposed between the first conductive line 140*e* and the second conductive line 140*f*, and the first right contact 150*d* may be disposed between the third conductive line 140*g* and the fourth conductive line 140*h*.

According to some example embodiments, a length of the first left contact 150*c* in the second direction, that is, a width W2*a* may be smaller than a space S2 between the first conductive line 140*e* and the second conductive line 140*f*. Likewise, a length of the first right contact 150*d* in the second direction, that is, a width W2*b* may be smaller than a space S2 between the third conductive line 140*g* and the fourth conductive line 140*h*. According to some example embodiments, the width W2*a* of the first left contact 150*c* may be substantially the same as the width W2*b* of the first right contact 150*d*. However, example embodiments are not limited thereto. For example, according to other example embodiments, the width W2*a* of the first left contact 150*c* may be different from the width W2*b* of the first right contact 150*d*.

The second contact 160*b* may be disposed on the second and third conductive lines 140*f* and 140*g* and the first contacts 150*c* and 150*d*, and form a single node by being electrically connected to the second and third conductive lines 140*f* and 140*g* and the first contacts 150*c* and 150*d*. Also, the second contact 160*b* may extend in the second direction, and accordingly, the second contact 160*b* may be disposed in a direction that horizontally crosses the second and third conductive lines 140*f* and 140*g* and the first contacts 150*c* and 150*d*. The second contact 160*b* may be formed of a material having electric conductivity, for example, polysilicon, metal, and/or metal alloy. Accordingly, the second contact 160*b* may provide, for example, an identical power voltage or an identical ground voltage to the second and third conductive lines 140*f* and 140*g* and the first contacts 150*c* and 150*d*.

According to some example embodiments, a length of the second contact 160*b* in the second direction, that is, a width W2*c* may be greater than a distance D2*a* between the first left contact 150*c* and the first right contact 150*d* and smaller than a distance D2*b* between the first conductive line 140*e* and the fourth conductive line 140*h*. Accordingly, the second contact 160*b* may be electrically connected to the second and third conductive lines 140*f* and 140*g*, the first left contact 150*c*, and the first right contact 150*d*, but not to the first and fourth conductive lines 140*e* and 140*h*.

According to some example embodiments, a length of the first left contact 150*c* in the first direction, that is, a height H2*a*, may be substantially the same as a length of the first right contact 150*d* in the first direction, that is, a height H2*b*. Accordingly, the first left contact 150*c*, the first right contact 150*d*, and the second contact 160*b* may form an H-shaped jumper. A jumper is a conducting wire having a relatively short length for connecting two points or two terminals in the IC 100C.

Although not illustrated, according to other example embodiments, the length of the first left contact 150*c* in the first direction, that is, the height H2*a*, may be different from the length of the first right contact 150*d* in the first direction, that is, the height H2*b*. Accordingly, the first left contact 150c, the first right contact 150d, and the second contact 160b may form an L-shaped jumper.

As described above, according to some example embodiments, a single node may be formed by electrically short-circuiting the second and third conductive lines 140f and 140g, the first contacts 150c and 150d, and the second contact 160b. Therefore, in the IC 100C manufactured based on the layout shown in FIG. 5, the second and third conductive lines 140f and 140g may be skipped. Thus, the H-shaped jumper according to some example embodiments may be referred to as a skip device.

Figure 6:
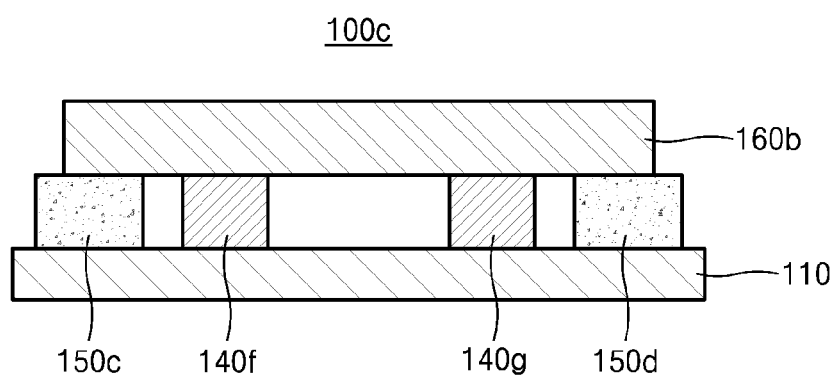
FIG. 6 is a cross-sectional view illustrating an example of a semiconductor device having the layout of FIG. 5.

FIG. 6 is a cross-sectional view illustrating an example of a semiconductor device 100c having the layout of FIG. 5.

Referring to FIG. 6, the semiconductor device 100c may include the substrate 110, the second and third conductive lines 140f and 140g, the first contacts 150c and 150d, and the second contact 160b. Although not illustrated, a voltage terminal providing, for example, a power voltage or a ground voltage may be additionally disposed on the second contact 160b.

The substrate 110 may be a semiconductor substrate that includes any one selected from, for example, silicon, SOI, silicon-on-sapphire, germanium, silicon-germanium, and gallium-arsenide. For example, the substrate 110 may be a P-type substrate. Also, although not illustrated, the substrate 110 may have an active region that is doped with impurities.

The second and third conductive lines 140f and 140g may be disposed on the substrate 110. According to some example embodiments, the second and third conductive lines 140f and 140g may be used as gate electrodes. In this case, a gate insulating layer may be additionally disposed between the second and third conductive lines 140f and 140g and the active region of the substrate 110.

The first contacts 150c and 150d may be disposed on the substrate 110. Therefore, the first contacts 150c and 150d may provide, for example, a power voltage or a ground voltage in the active region of the substrate 110. According to some example embodiments, the first contacts 150c and 150d may be respectively disposed at the left side of the second conductive line 140f and the right side of the third conductive line 140g. According to some example embodiments, upper portions of the first contacts 150c and 150d may be at a same level as upper portions of the second and third conductive lines 140f and 140g.

The second contact 160b may be disposed on and electrically connected to the second and third conductive lines 140f and 140g and the first contacts 150c and 150d. Accordingly, the second and third conductive lines 140f and 140g, the first contacts 150c and 150d, and the second contact 160b may form a single node.

Figure 7:
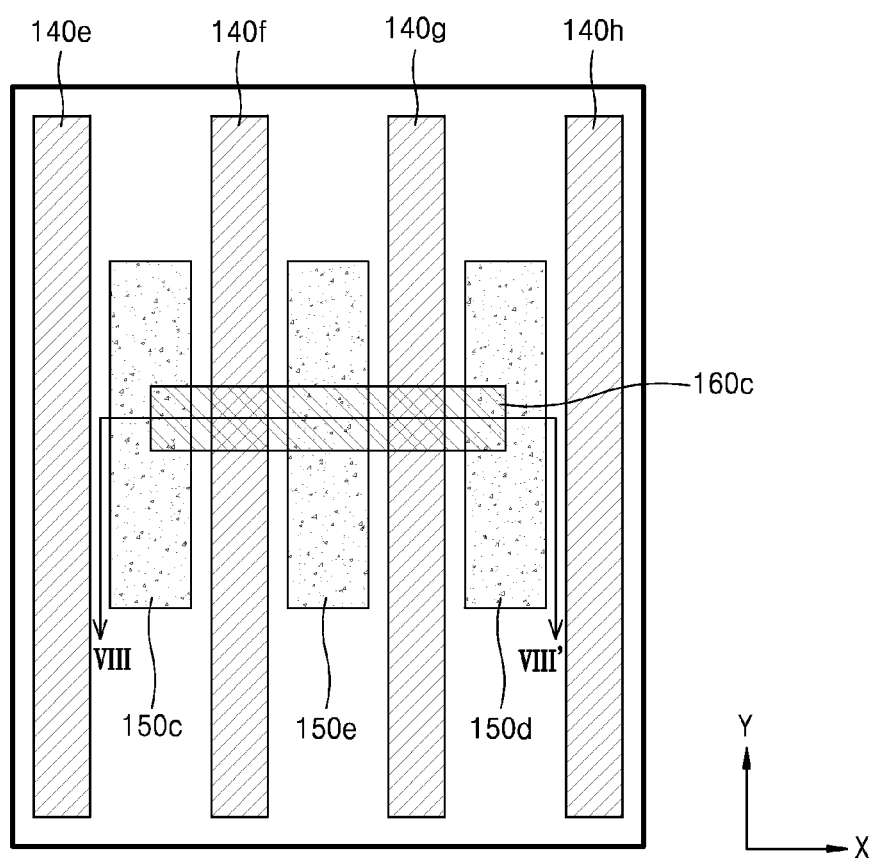
FIG. 7 is a layout illustrating a portion of an IC according to another example embodiment.

FIG. 7 is a layout illustrating a portion of an IC 100D according to other example embodiments.

Referring to FIG. 7, the IC 100D may include at least one cell defined by a cell boundary indicated with a bold line. The cell may include the first to fourth conductive lines 140e to 140h, the first left contact 150c, the first right contact 150d, a first central contact 150e, and a second contact 160c. The IC 100D is a modified example embodiment of the IC 100C shown in FIG, and thus, at least some of the descriptions of FIG. 5 may also be applied to the IC 100D. Therefore, features and elements already described with reference to FIG. 5 will not be repeated.

Unlike the IC 100C of FIG. 5, the IC 100D according to some example embodiments may further include the first central contact 150e. The first central contact 150e may be disposed between the second and third conductive lines 140f and 140g. According to some example embodiments, the second contact 160c may be electrically connected to the second and third conductive lines 140f and 140g and the first left, right, and central contacts 150c, 150d, and 150e and thus form a single node.

Figure 8:
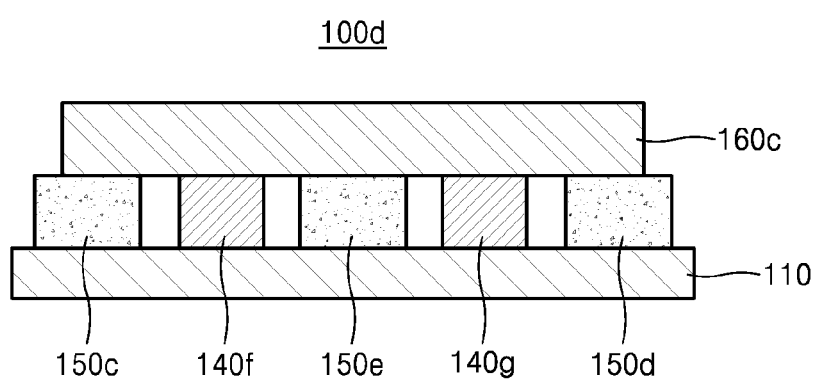
FIG. 8 is a cross-sectional view illustrating an example of a semiconductor device having the layout of FIG. 5, cut along line VIII-VIII' of FIG. 7.

FIG. 8 is a cross-sectional view illustrating an example of a semiconductor device 100d having the layout of FIG. 5, cut along line VIII-VIII' of FIG. 7;

Referring to FIG. 8, the semiconductor device 100d may include the substrate 110, second and third conductive lines 140f and 140g, the first left 150c, right 150d, and central 150e contacts, and the second contact 160c. The semiconductor device 100d is a modified embodiment of the semiconductor device 100c of FIG. 6, and, therefore, the descriptions of FIG. 6 may also be applied to the semiconductor device 100d. Therefore, features and elements already described with reference to FIG. 6 will not be repeated.

The first left, right, and central contacts 150c, 150d, and 150e, respectively, may be disposed on the substrate 110. Therefore, the first left contact 150c, first right contact 150d, and first central contact 150e may provide, for example, a power voltage or a ground voltage to the active region of the substrate 110. According to some example embodiments, the first central contact 150e may be disposed between the second and third conductive lines 140f and 140g. According to some example embodiments, upper portions of the first left, right, and central contacts 150c, 150d, and 150e, respectively, may be at a substantially same level as the upper portions of the second and third conductive lines 140f and 140g, respectively.

The second contact 160c may disposed on and electrically connected to the second and third conductive lines 140f and 140g and the first left, right, and central contacts 150c, 150d, and 150e. Accordingly, the second and third conductive lines 140f and 140g, the first left, right, and central contacts 150c, 150d, and 150e, respectively, and the second contact 160b may form a single node.

Figure 9:
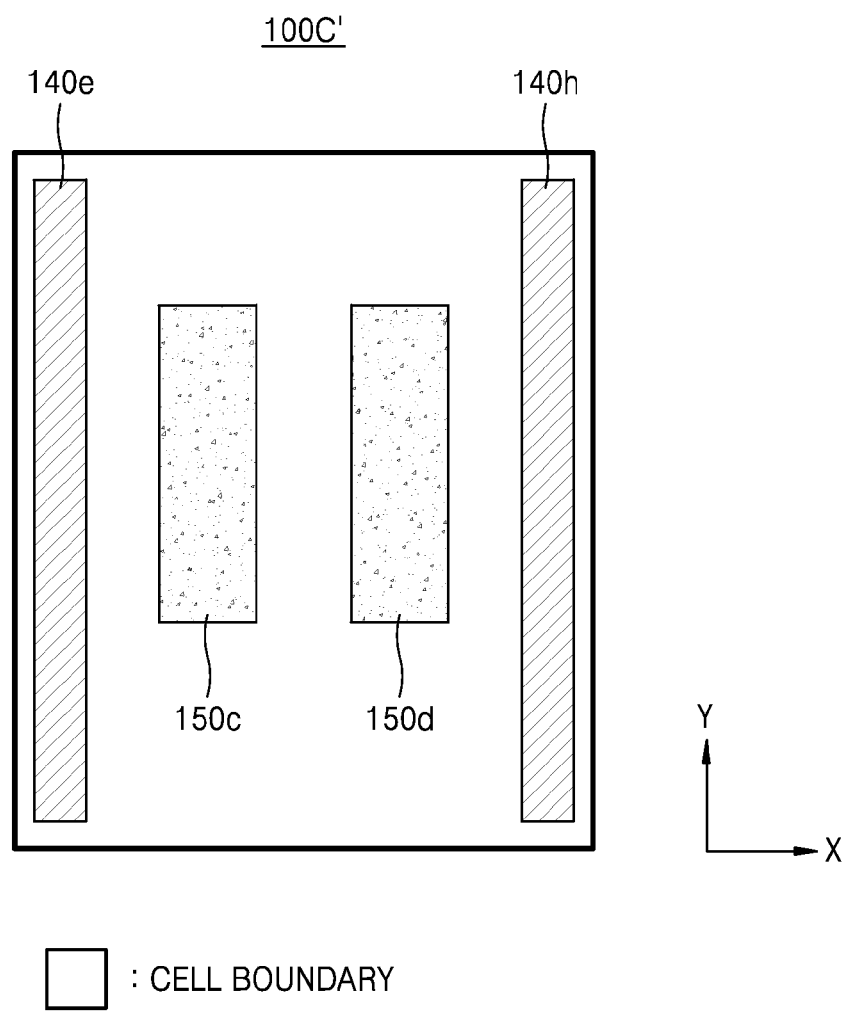
FIG. 9 is a layout illustrating a portion of an IC that is substantially the same as the example embodiment of FIG. 5.

FIG. 9 is a layout illustrating a portion of an IC 100C' that is substantially the same as the example embodiment of FIG. 5.

Referring to FIG. 9, the IC 100C' may include the first and fourth conductive lines 140e and 140h and the first contacts 150c and 150d. The first contacts 150c and 150d may be connected to an identical metal line disposed above the first contacts 150c and 150d. According to other example embodiments, the IC 100C' may include only one of the first contacts 150c and 150d.

The first contacts 150c and 150d and the second contact 160b included in the layout shown in FIG. 5 may form an H-shaped jumper. Therefore, when the IC 100C is actually manufactured, the IC 100C may be substantially the same as the IC 100C' that corresponds to the layout shown in FIG. 9. In other words, due to the H-shaped jumper in the layout shown in FIG. 5, the second and third conductive lines 140f and 140g may be skipped.

Likewise, the first left, right, and central contacts 150c, 150d, and 150e and the second contact 160c in the layout shown in FIG. 7 may form a jumper. Therefore, when the IC 100D is actually manufactured, the IC 100D may be substantially the same as the IC 100C' that corresponds to the layout shown in FIG. 9. In other words, due to the jumper in the layout shown in FIG. 7, the second and third conductive lines 140f and 140g may be skipped.

Figure 10:
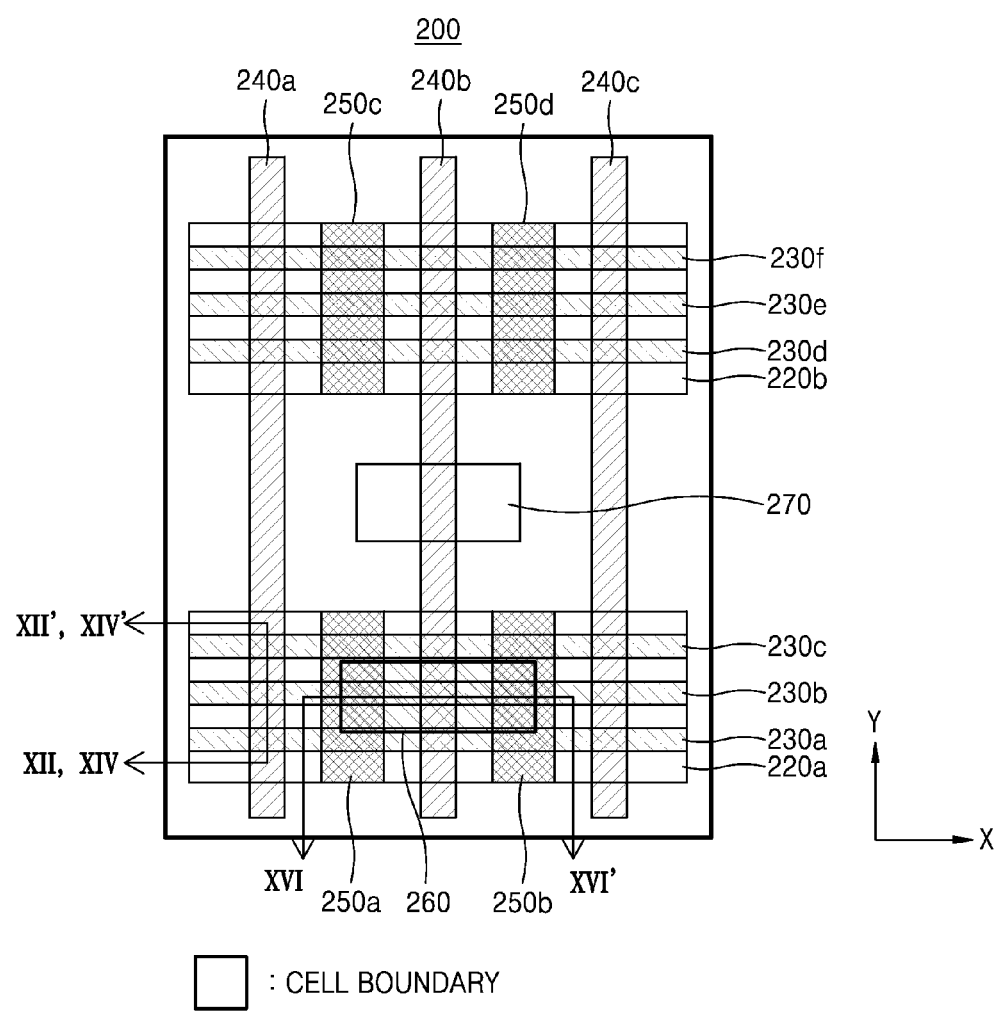
FIG. 10 is a layout illustrating an IC according to another example embodiment.

FIG. 10 is a layout illustrating an IC 200 according to other example embodiments.

Referring to FIG. 10, the IC 200 may include at least one cell defined by a cell boundary drawn with a bold line. Specifically, FIG. 10 illustrates an example of a standard cell in the IC 200. The standard cell includes, but is not limited to, first and second active regions 220*a* and 220*b*, a plurality of fins, a plurality of conductive lines, first contacts 250*a* to 250*d*, a second contact 260, and a cutting region 270.

According to some example embodiments, the plurality of fins may include first to sixth fins 230*a* to 230*f* and the plurality of conductive lines may include first to third conductive lines 240*a* to 240*c*. However, example embodiments are not limited thereto. For example, according to other example embodiment, the plurality of fins and the plurality of conductive lines may include various numbers of fins and conductive lines, respectively.

The first active region 220*a* may be where the first to third fins 230*a* to 230*c* are disposed, for example, an N-type metal oxide semiconductor (NMOS) defining layer. For example, the first active region 220*a* may be a random area in a P-type substrate. The second active region 220*b* may be where the fourth to sixth fins 230*d* to 230*f* are disposed, for example, a P-type MOS (PMOS) defining layer. For example, the second active region 220*b* may be an N-well region. Although not illustrated, a device separation region may be disposed between the first active region 220*a* and the second active region 220*b*.

The first to sixth fins 230*a* to 230*f* may be disposed in parallel to each other in the first direction (e.g., the Y direction) and extend in the second direction (e.g., the X direction) that is substantially perpendicular to the first direction. According to some example embodiments, the first to sixth fins 230*a* to 230*f* may be active fins. A channel width of a fin transistor formed by such fins may increase in proportion to the number of active fins, and accordingly, an amount of current flowing in the fin transistor may increase. Although not illustrated, the IC 200 may additionally include a dummy fin disposed on the device separation region.

According to some example embodiments, in the layout of the IC 200, the first to sixth fins 230*a* to 230*f* may have the same respective lengths in the first direction, i.e., respective widths. The respective widths of the first to sixth fins 230*a* to 230*f* are widths 2-dimensionally shown on the layout of FIG. 10. Since FIG. 10 is a 2D layout, respective heights of the first to sixth fins 230*a* to 230*f* are not shown.

The first to third conductive lines 240*a* to 240*c* may extend in the first direction (e.g., the Y direction). Also, the first to third conductive lines 240*a* to 240*c* may be disposed in parallel to each other in the second direction (e.g., the X direction) that is substantially perpendicular to the first direction. The first to third conductive lines 240*a* to 240*c* may be formed of a material having electric conductivity, for example, polysilicon, metal, and/or metal alloy. According to some example embodiments, the first to third conductive lines 240*a* to 240*c* may correspond to gate electrodes.

The first contacts 250*a* to 250*d* may extend in the first direction (e.g., the Y direction). Also, the first contacts 250*a* to 250*d* may be disposed in parallel to each other in the second direction (e.g., the X direction) that is substantially perpendicular to the first direction. The first contacts 250*a* to 250*d* may be formed of a material having electric conductivity, for example, polysilicon, metal, and/or metal alloy.

According to some example embodiments, the first contacts 250*a* to 250*d* may include first lower contacts 250*a* and 250*b* on the first active region 220*a* and first upper contacts 250*c* and 250*d* on the second active region 220*b*. The first lower contacts 250*a* and 250*b* may be contacts connected to the first active region 220*a*, for example, source and drain contacts. Therefore, the first lower contacts 250*a* and 250*b* may provide, for example, a power voltage or a ground voltage to the first active region 220*a*. The first upper contacts 250*c* and 250*d* may be contacts connected to the second active region 220*b*, for example, source and drain contacts. Therefore, the first upper contacts 250*c* and 250*d* may provide, for example, a power voltage or a ground voltage to the second active region 220*b*.

According to some example embodiments, the first lower contacts 250*a* and 250*b* may respectively be disposed at two sides of the second conductive line 240*b*. In particular, the first lower contacts 250*a* and 250*b* may include a first lower left contact 250*a* disposed at a left side of the second conductive line 240*b* and a first lower right contact 250*b* disposed at a right side of the second conductive line 240*b*. In other words, the first lower left contact 250*a* may be disposed between the first and second conductive lines 240*a* and 240*b*, and the first lower right contact 250*b* may be disposed between the second and third conductive lines 240*b* and 240*c*.

The second contact 260 may be disposed on the second conductive line 240*b* and the first lower contacts 250*a* and 250*b*, and form a single node by being electrically connected to the second conductive line 240*b* and the first lower contacts 250*a* and 250*b*. Also, the second contact 260 may extend in the second direction, that is, in and accordingly, the second contact 260 may be disposed in a direction that horizontally crosses the second conductive line 240*b* and the first lower contacts 250*a* and 250*b*. The second contact 260 may be formed of a material having electric conductivity, for example, polysilicon, metal, and/or metal alloy. Therefore, the second contact 260 may provide, for example, an identical power voltage or an identical ground voltage to the second conductive line 240*b* and the first lower contacts 250*a* and 250*b*.

According to some example embodiments, the first to third conductive lines 240*a* to 240*c*, the first lower contacts 250*a* and 250*b*, and the second contact 260 disposed on the first active region 220*a* may be substantially the same as IC 100A illustrated in FIG. 1. Therefore, the description of FIG. 1 may also be applied to the IC 200, and features and elements already described with reference to FIG. 1 will not be repeated.

As described above, according to some example embodiments, a single node may be formed by electrically short-circuiting the second conductive line 240*b*, the first lower contacts 250*a* and 250*b*, and the second contact 260 on the first active region 220*a*. Therefore, in the IC 200 manufactured based on the layout shown in FIG. 10, the second conductive line 240*b* may be skipped in the first active region 220*a* but not skipped in the second active region 220*b*. Therefore, the IC 200 may include an asymmetrical gate in which two transistors, for example, two NMOS fin transistors, are in the first active region 220*a*, and three transistors, for example, three PMOS fin transistors, are in the second active region 220*b*.

Although FIG. 10 illustrates an example embodiment in which the second contact 260 is disposed on the first active region 220*a*, example embodiments are not limited thereto. For example, according to other example embodiments, the second contact 260 may be disposed on both of the first and second active regions 220*a* and 220*b*. In this case, the same number of transistors may be disposed on the first and second active regions 220*a* and 220*b*. According to other example embodiments, the second contact 260 may be disposed only on the second active region 220*b*. In this case, more transistors may be disposed on the first active region 220*a* than on the second active region 220*b*.

Figure 11:
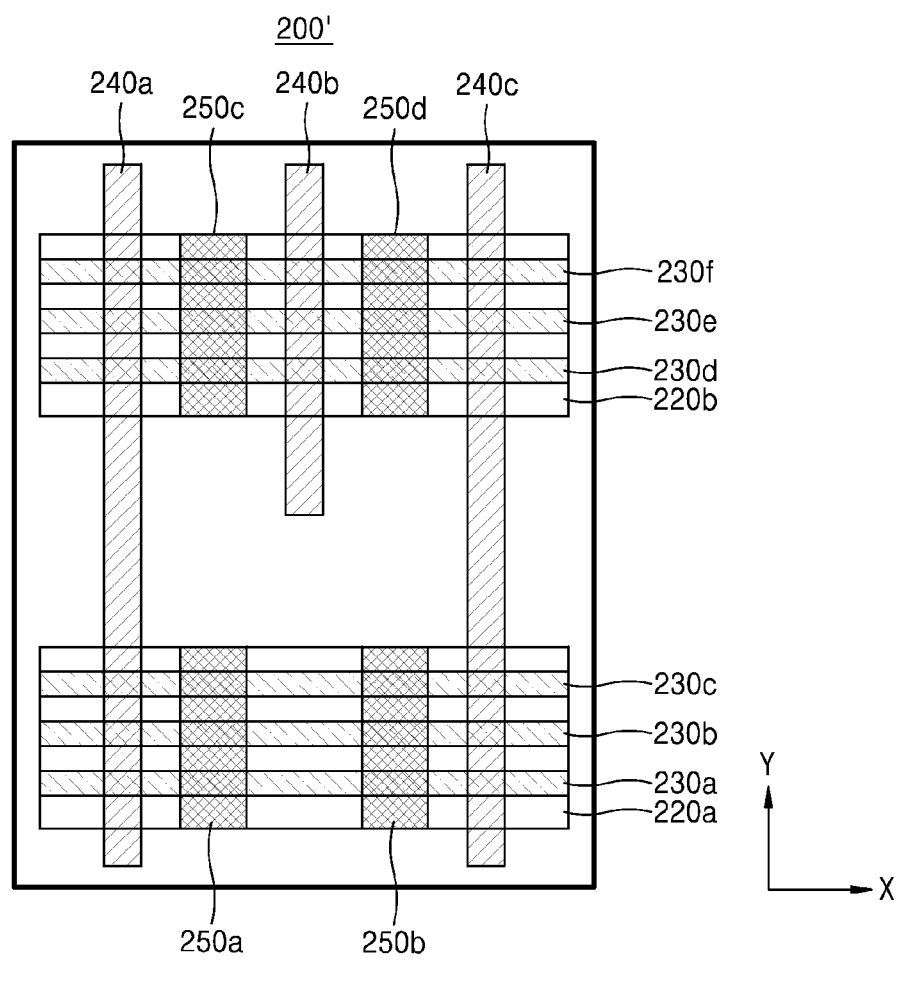
FIG. 11 is a layout illustrating an IC that is substantially the same as the example embodiment of FIG. 10.

FIG. 11 is a layout illustrating an IC 200' that is substantially the same as the example embodiments of FIG. 10.

Referring to FIG. 11, the IC 200' may include the first to third conductive lines 240a to 240c and the first contacts 250a to 250d. The first lower contacts 250a and 250b disposed on the first active region 220a may be connected to an identical metal line above the first lower contacts 250a and 250b. According to other example embodiments, the IC 200' may include only one of the first lower contacts 250a and 250b.

The first lower contacts 250a and 250b and the second contact 260 included in the layout shown in FIG. 10 may form an H-shaped jumper. Therefore, when the IC 200 is actually manufactured, the IC 200 may be substantially the same as the IC 200' that corresponds to the layout shown in FIG. 11. In other words, due to the H-shaped jumper in the layout shown in FIG. 10, the second conductive line 240b in the first active region 220a may be skipped. Therefore, as illustrated in FIG. 11, the second conductive line 240b may be skipped in the first active region 220a, and, thus, the ICs 200 and 200' may include two NMOS fin transistors in the first active region 220a, and three PMOS fin transistors in the second active region 220b.

Figure 12:
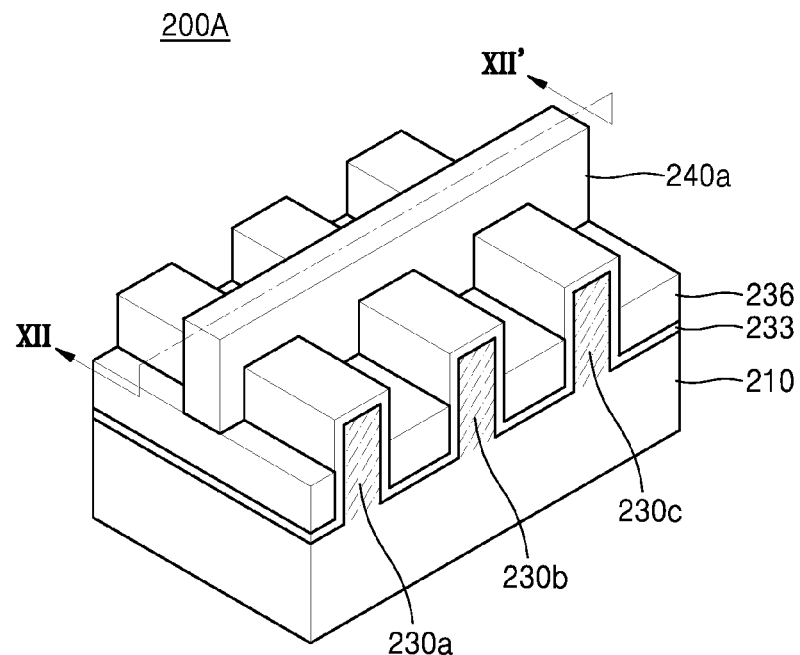
FIG. 12 is a perspective view illustrating an example of a semiconductor device having the layout of FIG. 10.
Figure 13:
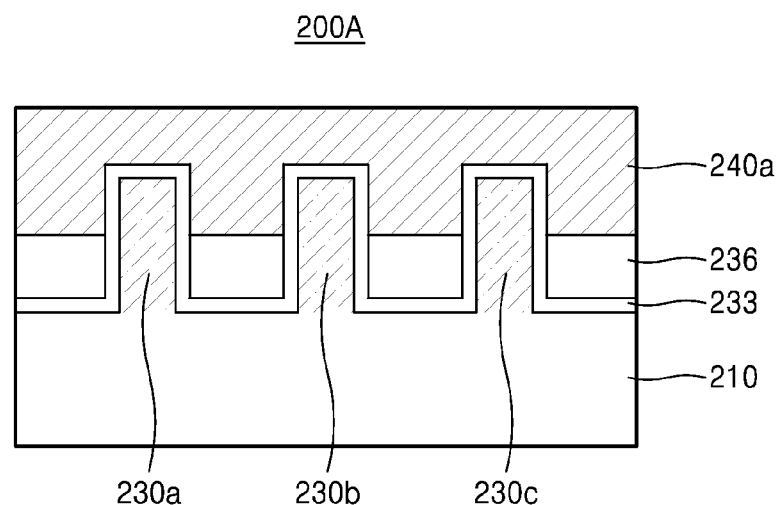
FIG. 13 is a cross-sectional view illustrating the semiconductor device cut along line XII-XII' of FIG. 12.

FIG. 12 is a perspective view illustrating an example of a semiconductor device 200A having the layout of FIG. 10. FIG. 13 is a cross-sectional view illustrating the semiconductor device 200A cut along line XII-XII' of FIG. 12.

Referring to FIGS. 12 and 13, the semiconductor device 200A may be a bulk type fin transistor. The semiconductor device 200A may include a substrate 210, a first insulating layer 233, a second insulating layer 236, the first to third fins 230a to 230c, and the first conductive line (hereinafter referred to as a 'gate electrode') 240a.

The substrate 210 may be a semiconductor substrate that includes any one selected from, for example, silicon, SOI, silicon-on-sapphire, germanium, silicon-germanium, and gallium-arsenide. The substrate 210 may be a P-type substrate and used as the first active region 220a.

The first to third fins 230a to 230c may be disposed such that they are connected to the substrate 210. According to some example embodiments, the first to third fins 230a to 230c may be active regions formed by doping portions vertically protruding from the substrate 210 with n+ or p+ impurities.

The first and second insulating layers 233 and 236 may include an insulating material selected from, for example, an oxide, a nitride, and/or an oxynitride. The first insulating layer 233 may be disposed on the first to third fins 230a to 230c. The first insulating layer 233 may be used as a gate insulating layer by being disposed between the first to third fins 230a to 230c and the gate electrode 240a. The second insulating layer 236 may be formed at spaces between the first to third fins 230a to 230c to a certain height. The second insulating layer 236 may be used as a device separation layer by being disposed between the first to third fins 230a to 230c.

The gate electrode 240a may be disposed on the first and second insulating layers 233 and 236. Accordingly, the gate electrode 240a may surround the first to third fins 230a to 230c, the first insulating layer 233, and the second insulating layer 236. In other words, the first to third fins 230a to 230c may be located inside the gate electrode 240a. The gate electrode 240a may include a metallic material such as tungsten (W) or tantalum (Ta), a nitride of the metallic material, a silicide of the metallic material, and/or a doped polysilicon, and formed by using deposition processes.

Figure 14:
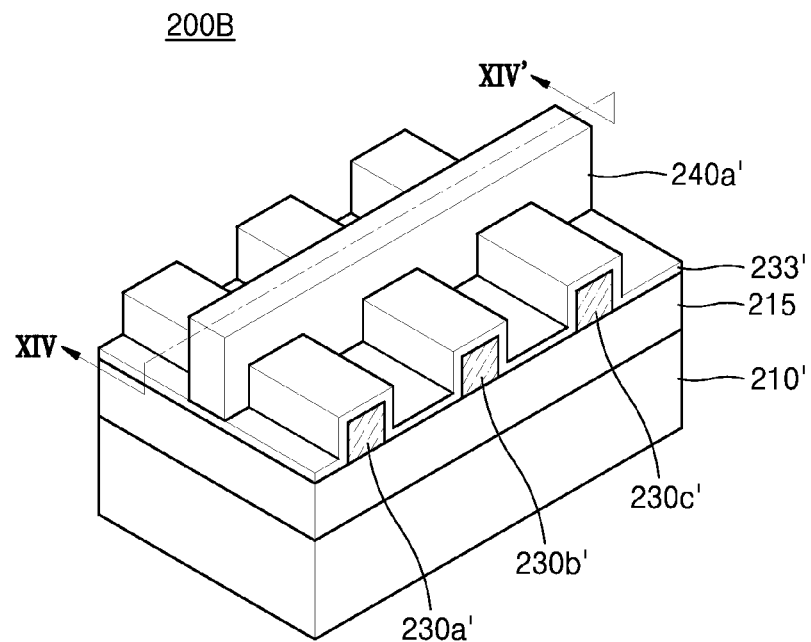
FIG. 14 is a perspective view illustrating another example of a semiconductor device having the layout of FIG. 10.
Figure 15:
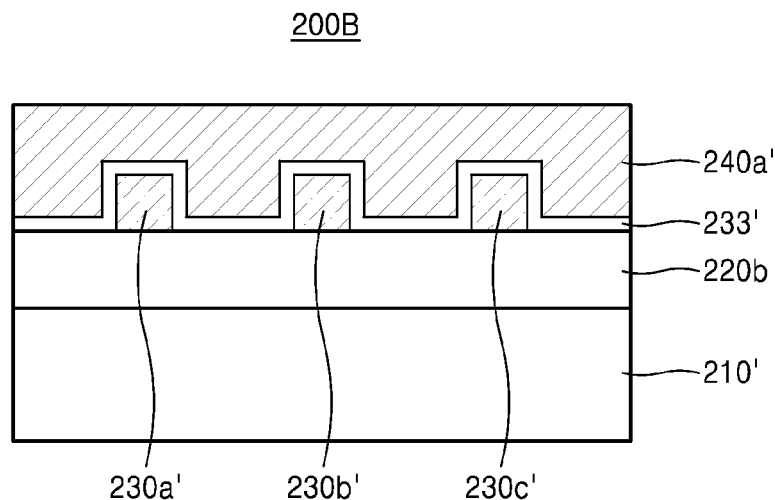
FIG. 15 is a cross-sectional view illustrating the semiconductor device cut along line XIV-XIV' of FIG. 14.

FIG. 14 is a perspective view illustrating another example of a semiconductor device 200B having the layout of FIG. 10. FIG. 15 is a cross-sectional view illustrating the semiconductor device 200B cut along line XIV-XIV' of FIG. 14.

Referring to FIGS. 14 and 15, the semiconductor device 200B may be an SOI type fin transistor. The semiconductor device 200B may include a substrate 210', a first insulating layer 215, a second insulating layer 233', first to third fins 230a' to 230c', and a first conductive line (hereinafter referred to as 'gate electrode') 240a'. The semiconductor device 200B is a modified example embodiment of the semiconductor device 200A shown in FIGS. 12 and 13. Therefore, features and elements of the semiconductor 200B that are different from the semiconductor device 200A will be mainly described, and features and elements already described with reference to FIGS. 12 and 13 will not be repeated.

The first insulating layer 215 may be disposed on the substrate 210'. The second insulating layer 233' may be used as a gate insulating layer by being disposed between the first to third fins 230a' to 230c' and the gate electrode 240a'. The first to third fins 230a' to 230c' may include a semiconductor material, for example, silicon and/or doped silicon.

The gate electrode 240a' may be disposed on the second insulating layer 233'. Therefore, the gate electrode 240a' may surround the first to third fins 230a' to 230c' and the second insulating layer 233'. In other words, the first to third fins 230a' to 230c' may be located inside the gate electrode 240a'.

Figure 16:
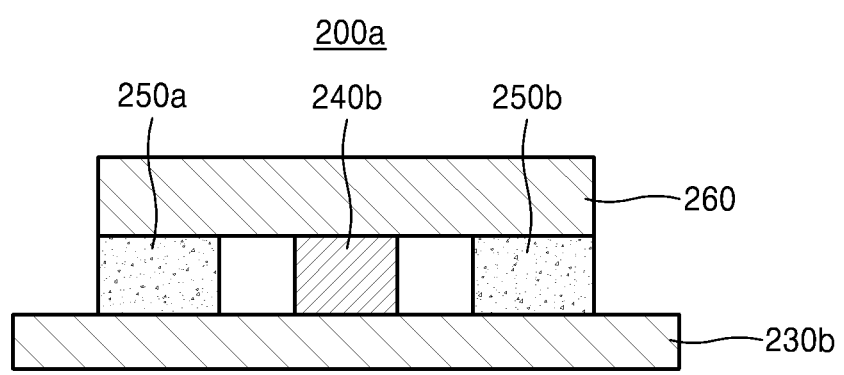
FIG. 16 is a cross-sectional view illustrating a semiconductor device having the layout of FIG. 10, cut along line XVI-XVI' of FIG. 10.

FIG. 16 is a cross-sectional view illustrating a semiconductor device 200a having the layout of FIG. 10, cut along line XVI-XVI' of FIG. 10.

Referring to FIG. 16, the semiconductor device 200A may include the second fin 230b, the second conductive line 240b, the first lower contacts 250a and 250b, and the second contact 260. Although not illustrated, a voltage terminal providing, for example, a power voltage or a ground voltage may be additionally disposed on the second contact 260.

The second conductive line 240b may be disposed on the second fin 230b. According to some example embodiments, the second conductive line 240b may be used as a gate electrode, and a gate insulating layer may be additionally disposed between the second conductive line 240b and the second fin 230b.

The first lower contacts 250a and 250b may be disposed on the second fin 230b. Therefore, the first lower contacts 250a and 250b may provide, for example, a power voltage or a ground voltage to the second fin 230b. According to some example embodiments, the first lower contacts 250a and 250b may respectively be disposed at two sides of the second conductive line 240b. According to some example embodiments, upper portions of the first lower contacts 250a and 250b may be at a same level as an upper portion of the second conductive line 240b.

The second contact 260 may be disposed on and electrically connected to the second conductive line 240b and the first lower contacts 250a and 250b. Accordingly, the second conductive line 240b, the first lower contacts 250a and 250b, and the second contact 260 may form a single node.

Figure 17:
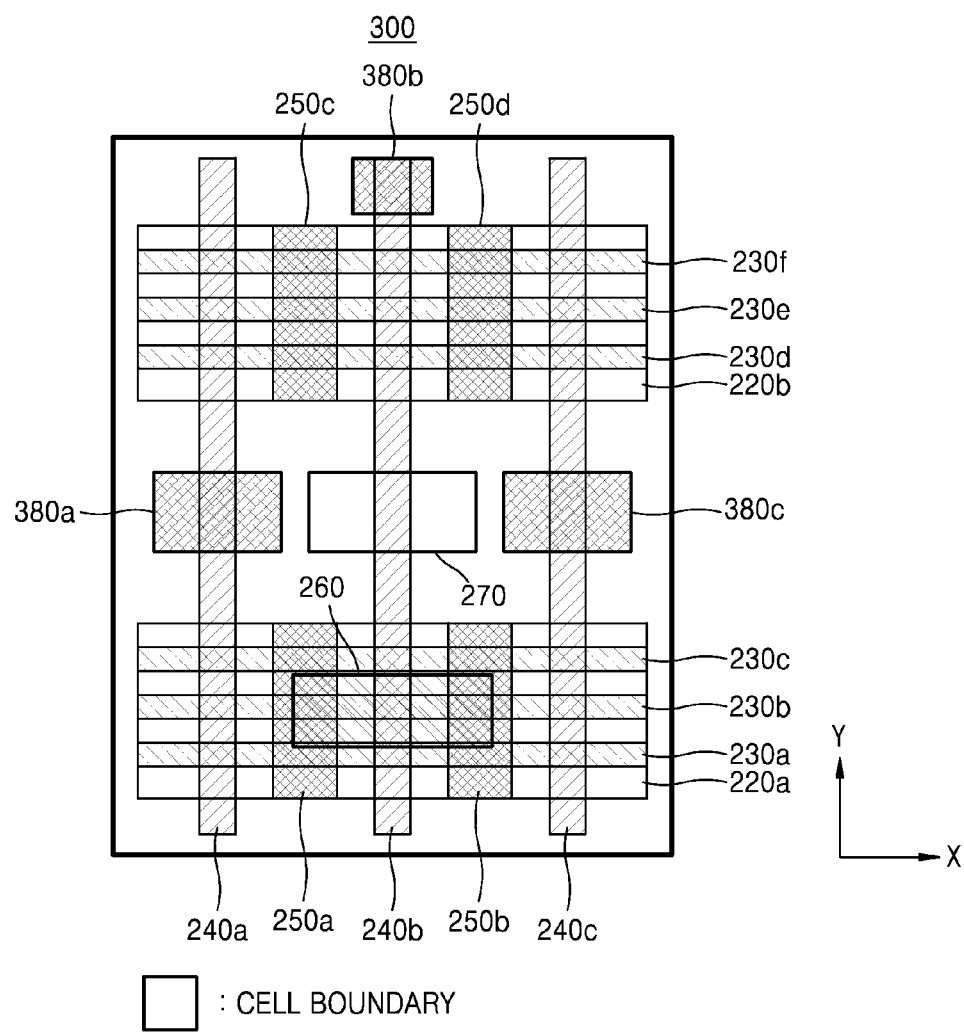
FIG. 17 is a layout illustrating an IC according to another example embodiment.

FIG. 17 is a layout illustrating an IC 300 according to other example embodiments.

Referring to FIG. 17, the IC 300 may include at least one cell defined by a cell boundary drawn with a bold line. Specifically, FIG. 17 illustrates an example of a standard cell in the IC 300. The standard cell may include the first and second active regions 220a and 220b, the first to sixth fins 230a to 230f, the first to third conductive lines 240a to 240c, the first contacts 250a to 250d, the second contact 260, the cutting region 270, and third contacts 380a to 380c. The IC 300 is a modified example embodiment of the IC 200 shown in FIG. 10. Therefore, the descriptions of FIG. 10 may also be applied to the IC 300, and, thus, features and elements already described with reference to FIG. 10 will not be repeated.

In comparison to the IC 200 of FIG. 10, the IC 300 according to some example embodiments may additionally include the third contacts 380a to 380c. A first one of the third contacts 380a may be disposed on and electrically connected to the first conductive line 240a. A third one of the third contacts 380c may be disposed on and electrically connected to the third conductive line 240c.

A second one of the third contacts 380b may be disposed on and electrically connected to the second conductive line 240b. Since the cutting region 270 is in the middle of the second conductive line 240b, the third contact 380b is electrically connected to only the second conductive line 240b on the second active region 220b, but not to the second conductive line 240b of the first active region 220a.

According to some example embodiments, a single node may be formed by electrically short-circuiting the second conductive line 240b, the first lower contacts 250a and 250b, and the second contact 260 on the first active region 220a. Therefore, in the IC 300 manufactured based on the layout shown in FIG. 17, the second conductive line 240b may be skipped in the first active region 220a but not skipped in the second active region 220b such that the IC 300 has an asymmetrical gate. Therefore, the IC 300 may include two transistors, for example, two NMOS fin transistors, in the first active region 220a, and three transistors, for example, three PMOS fin transistors, in the second active region 220b.

Although FIG. 17 illustrates an example embodiment in which the second contact 260 is disposed on the first active region 220a, example embodiments are not limited thereto. For example, according to other example embodiments, the second contact 260 may be disposed on both of the first and second active regions 220a and 220b. In this case, the same number of transistors may be disposed on the first and second active regions 220a and 220b. According to other example embodiments, the second contact 260 may be disposed only on the second active region 220b. In this case, more transistors may be disposed on the first active region 220a than on the second active region 220b.

Figure 18:
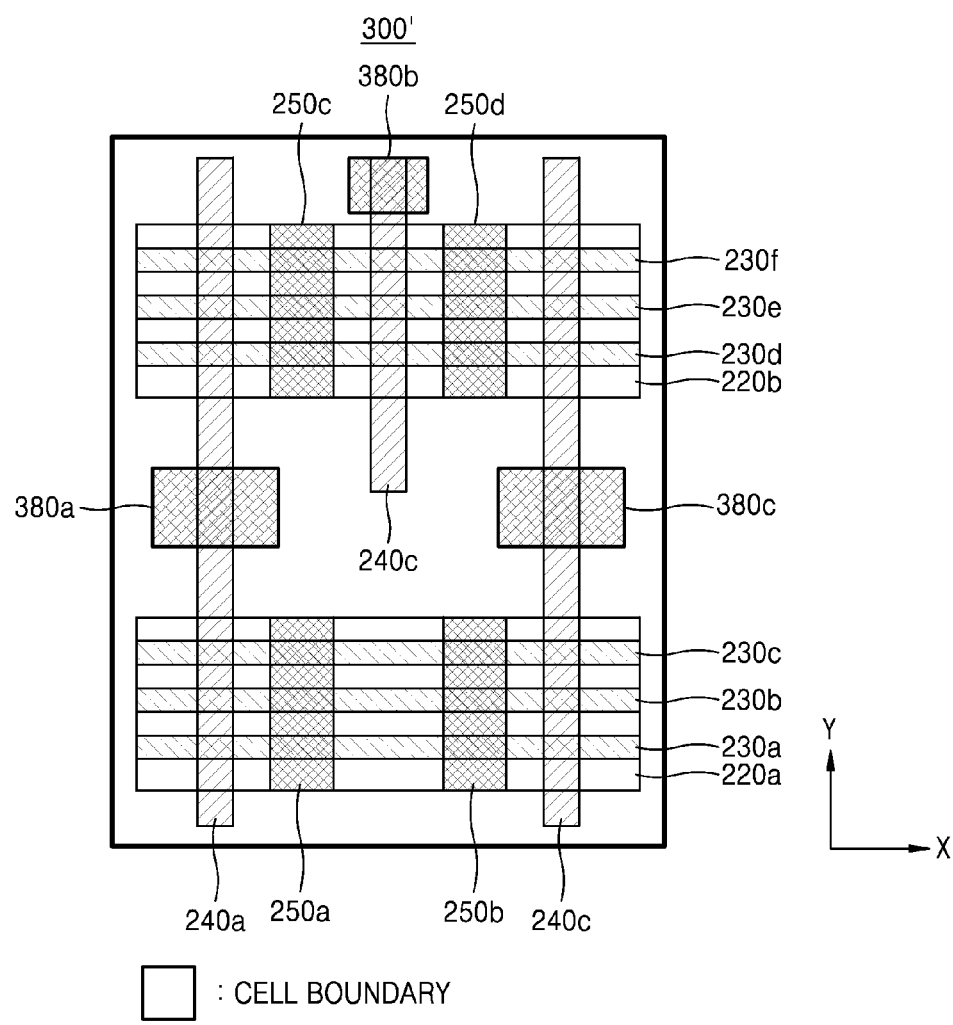
FIG. 18 is a layout illustrating a portion of an IC that is substantially the same as the example embodiment of FIG. 17.

FIG. 18 is a layout illustrating a portion of an IC 300' that is substantially the same as the example embodiment of FIG. 17.

Referring to FIG. 18, the IC 300' may include the first to third conductive lines 240a to 240c, the first contacts 250a to 250d, and the third contacts 380a to 380c. The first lower contacts 250a and 250b on the first active region 220a may be connected to an identical metal line above the first lower contacts 250a and 250b. According to other example embodiments, the IC 300' may include only one of the first lower contacts 250a and 250b.

The first lower contacts 250a and 250b and the second contact 260 included in the layout shown in FIG. 17 may form an H-shaped jumper. Therefore, when the IC 300 is actually manufactured, the IC 300 may be substantially the same as the IC 300' that corresponds to the layout shown in FIG. 18. In other words, as shown in FIG. 18, due to the H-shaped jumper in the layout shown in FIG. 17, the second conductive line 240b in the first active region 220a may be skipped. Therefore, the ICs 300 and 300' may include two NMOS fin transistors in the first active region 220a, and three PMOS fin transistors in the second active region 220b.

Figure 19:
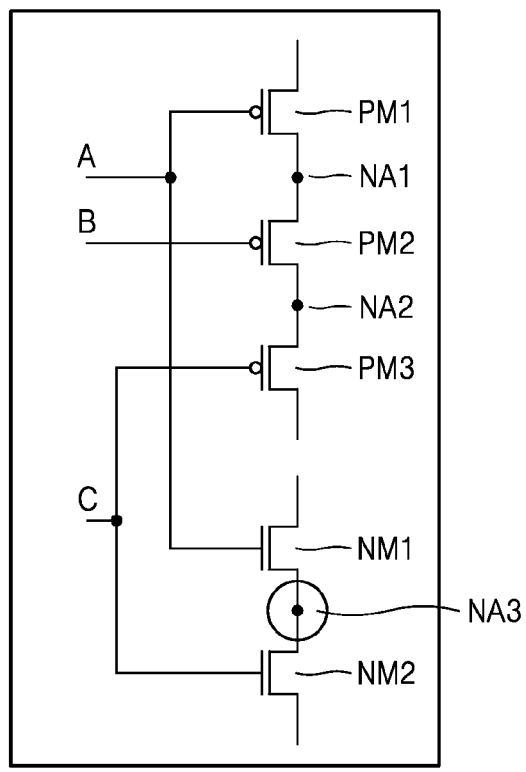
FIG. 19 is a circuit diagram illustrating the IC of FIG. 17.

FIG. 19 is a circuit diagram illustrating the IC 300 of FIG. 17.

Referring to FIGS. 17 and 19, the IC 300 may include first to third PMOS fin transistors PM1 to PM3 and first and second NMOS fin transistors NM1 and NM2. The first to third PMOS fin transistors PM1 to PM3 may be formed on the second active region 220b, and the first and second NMOS fin transistors NM1 and NM2 may be formed on the first active region 220a.

Respective gates of the first PMOS fin transistor PM1 and the first NMOS fin transistor NM1 are both connected to a node A that may correspond to the first one of the third contacts 380a. Also, a gate of the second PMOS fin transistor PM2 may be connected to a node B that may correspond to the second one of the third contacts 380b. Also, respective gates of the third PMOS fin transistor PM3 and the second NMOS fin transistor NM2 may both be connected to a node C that may correspond to the third one of the third contacts 380c.

Specifically, in some example embodiments, the gate of the first PMOS fin transistor PM1 may be connected to the third contact 380a, a drain of the first PMOS fin transistor PM1 may be connected to the first node area NA1, and the first node area NA1 may correspond to a first left upper contact 250c. The gate of the second PMOS fin transistor PM2 may be connected to the third contact 380b, a drain of the second PMOS fin transistor PM2 may be connected to a second node area NA2, and the second node area NA2 may correspond to a first right upper contact 250d. The gate of the third PMOS fin transistor PM3 may be connected to the third one of the third contacts 380c.

The gate of the first NMOS fin transistor NM1 may be connected to the first one of the third contacts 380a, and the gate of the second NMOS fin transistor NM2 may be connected to the third one of the third contacts 380c. The first and second NMOS fin transistors NM1 and NM2 may be connected to a third node area NA3 that may correspond to a jumper formed by the first lower contacts 250a and 250b and the second contact 260 of FIG. 17.

Figure 20:
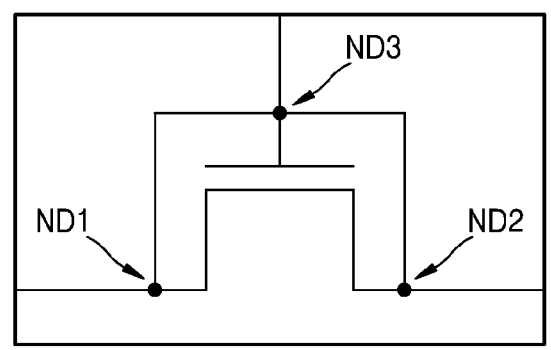
FIG. 20 is a circuit diagram illustrating a third node area of FIG. 19 in detail.

FIG. 20 is a circuit diagram illustrating the third node area NA3 of FIG. 19 in detail.

Referring to FIGS. 17, 19 and 20, a single node area, that is, the third node area NA3 may be formed by connecting a first node ND1 between the second fin 230b and the first lower left contact 250a, a second node ND2 between the second fin 230b and the first lower right contact 250b, and a third node ND3 between the second contact 260 and the second conductive line 240b.

Figure 21:
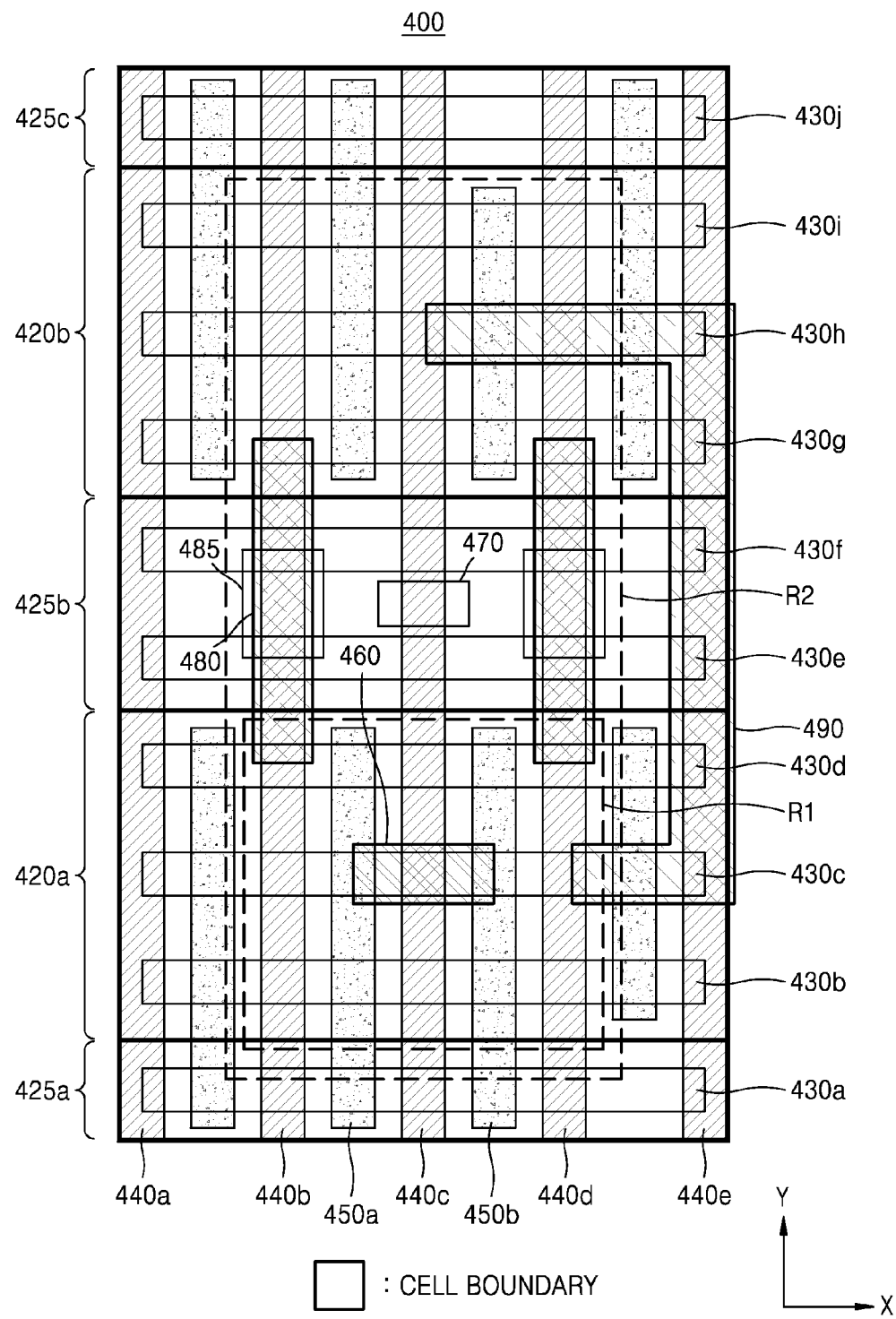
FIG. 21 is a layout illustrating an IC according to another example embodiment.

FIG. 21 is a layout illustrating an IC 400 according to other example embodiments.

Referring to FIG. 21, the IC 400 may include at least one cell defined by a cell boundary drawn with a bold line. Specifically, FIG. 21 illustrates an example of a standard cell in the IC 400. The standard cell may include first to tenth fins 430a to 430j, a plurality of gate electrodes 440b, 440c, and 440d, a plurality of dummy gate electrodes 440a and 440e, a plurality of source and drain contacts 450a and 450b, a second contact 460, a cutting region 470, two input terminals 480, two input contacts 485, and an output terminal 490.

According to example embodiments, the first, fifth, sixth, and tenth fins 430a, 430e, 430f, and 430j may be dummy fins, and the second to fourth and seventh to ninth fins 430b to 430d and 430g to 430i may be active fins. Specifically, the second to fourth fins 430b to 430d may be disposed in a first active region 420a, and the seventh to ninth fins 430g to 430i may be disposed in a second active region 420b. The first fin 430a may be disposed in a first device separation region 425*a*, the fifth and sixth fins 430*e* and 430*f* may be disposed in a second device separation region 425*b*, and the tenth fin 430*j* may be disposed in the third device separation region 425*c*.

First, the first to tenth fins 430*a* to 430*j* may be formed on a semiconductor substrate (not shown) in advance by performing a single manufacturing process. Second, the plurality of source and drain contacts 450*a* and 450*b* and gate electrodes including the plurality of gate electrodes 440*b*, 440*c*, and 440*d* and the plurality of dummy gate electrodes 440*a* and 440*e* may be formed. Third, the second contact 460 may be formed on the gate electrode 440*c* and the plurality of source and drain contacts 450*a* and 450*b*. Fourth, the two input terminals 480 and the output terminal 490 may be formed.

A first region R1 is similar to the layout shown in FIG. 1, and, therefore, the example embodiments described above with reference to FIGS. 1 to 9 may be applied to the first region R1. A second region R2 is similar to the layout shown in FIG. 10, and, therefore, the example embodiments described above with reference to FIGS. 10 to 20 may be applied to the second region R2. According to some example embodiments, the second to fourth fins 430*b* to 430*d* may form an NMOS transistor, and the seventh to ninth fins 430*g* to 430*i* may form a PMOS transistor.

Although FIG. 21 illustrates an example embodiment in which the second contact 460 is disposed on the first active region 420*a*, example embodiments are not limited thereto. For example, according to other example embodiments, the second contact 460 may be disposed on both of the first and second active regions 420*a* and 420*b*. In this case, the same number of transistors may be disposed on the first and second active regions 420*a* and 420*b*. According to other example embodiments, the second contact 460 may be disposed only on the second active region 420*b*. In this case, more transistors may be disposed on the first active region 220*a* than on the second active region 220*b*.

Figure 22:
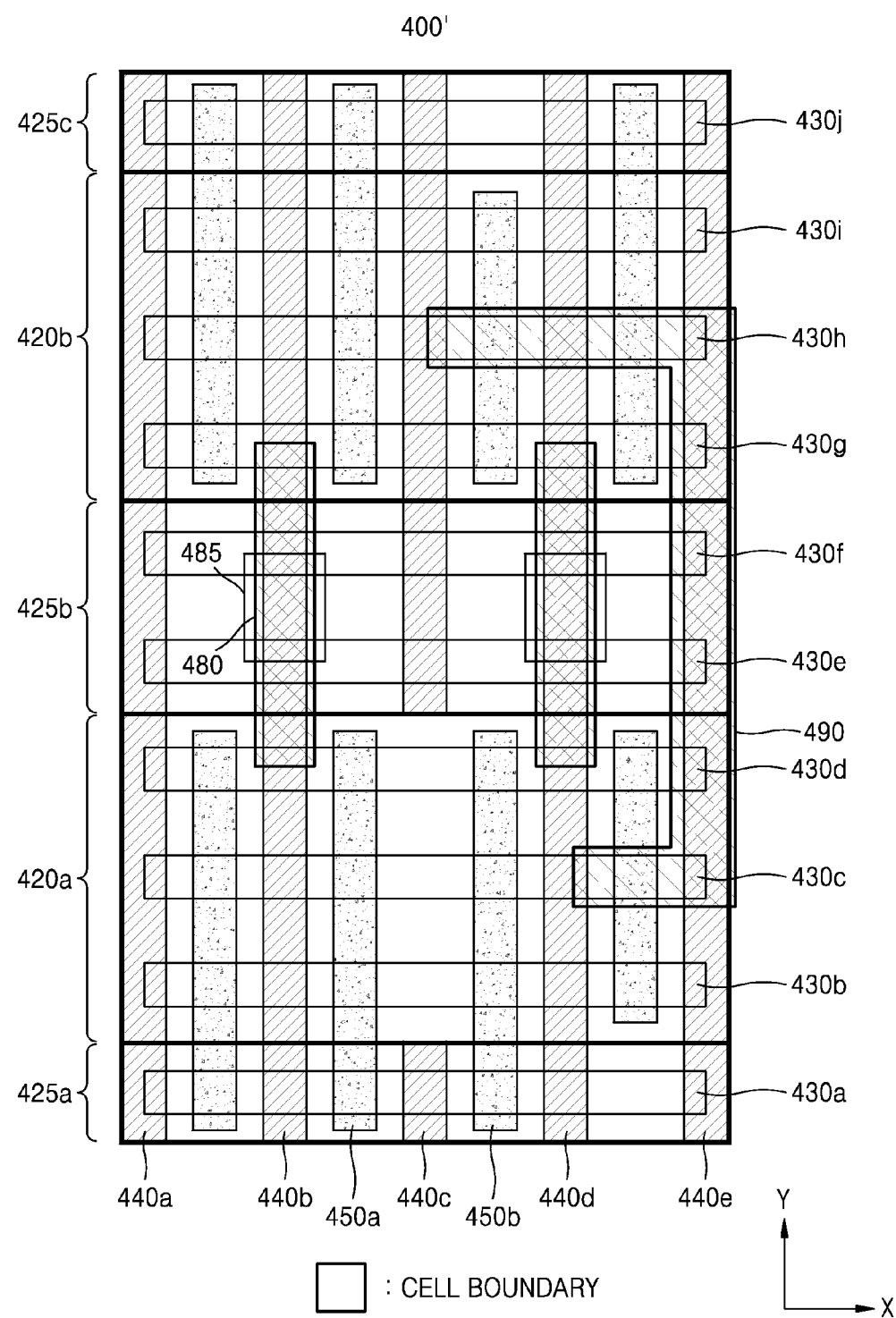
FIG. 22 is a layout illustrating a portion of an IC that is substantially the same as the example embodiment of FIG. 21.

FIG. 22 is a layout illustrating a portion of an IC 400' that is substantially the same as the example embodiment of FIG. 21.

Referring to FIG. 22, the IC 400' may include the first to tenth fins 430*a* to 430*j*, the plurality of gate electrodes 440*b*, 440*c*, and 440*d*, the plurality of dummy gate electrodes 440*a* and 440*e*, the plurality of source and drain contacts 450*a* and 450*b*, the second contact 460, the two input terminals 480, the two input contacts 485, and the output terminal 490. The plurality of source and drain contacts 450*a* and 450*b* on the first active region 420*a* may be connected to an identical metal line above the plurality of source and drain contacts 450*a* and 450*b*. According to other example embodiments, the IC 400' may include only one of the plurality of source and drain contacts 450*a* and 450*b* on the first active region 420*a*.

The plurality of source and drain contacts 450*a* and 450*b* and the second contact 460 included in the layout shown in FIG. 21 may form an H-shaped jumper. Therefore, when the IC 400 is actually manufactured, the IC 400 may be substantially the same as the IC 400' that corresponds to the layout shown in FIG. 22. In other words, as shown in FIG. 22, due to the H-shaped jumper in the layout shown in FIG. 21, the gate electrode 440*c* in the first active region 420*a* of FIG. 22 may be skipped. Therefore, each of the ICs 400 and 400' may include two NMOS fin transistors in the first active region 420*a* and three PMOS fin transistors in the second active region 420*b*.

Figure 23:
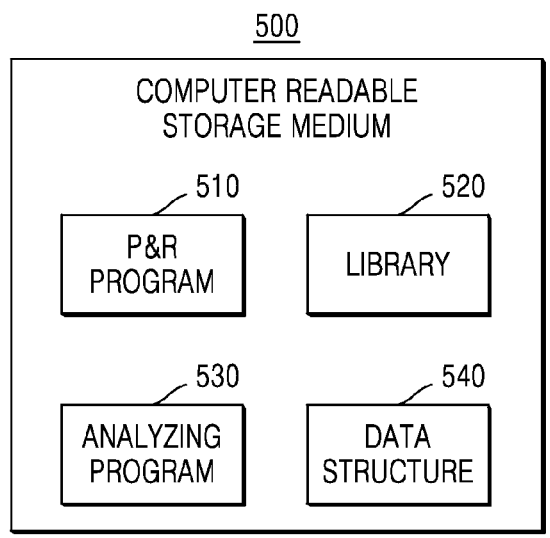
FIG. 23 is a block diagram illustrating a storage medium according to an example embodiment.

FIG. 23 is a block diagram illustrating a computer-readable storage medium 500 according to some example embodiments.

Referring to FIG. 23, the computer-readable storage medium 500 may include a storage medium that may be read by a computer, for example, to provide commands and/or data to the computer. The computer-readable storage medium 500 may be non-transitory. For example, the non-transitory computer-readable storage medium 500 may include a magnetic storage medium (e.g., a disk or a tape) and an optical recording medium (a CD-ROM, a DVD-ROM, a CD-R, a CD-RW, a DVD-R, and a DVD-RW), volatile or non-volatile memory (e.g., RAM, ROM, or flash memory), non-volatile memory that may accessed via USB interface, and microelectromechanical systems (MEMS). The computer-readable recording medium may be inserted into a computer, integrated into the computer, or combined with the computer via a communication medium such as a network and/or a wireless link.

As shown in FIG. 23, the computer-readable storage medium 500 may have stored therein a position and wiring program 510, a library 520, an analyzing program 530, and a data structure 540. The position and wiring program 510 may store a plurality of commands for executing a method of using a standard cell library or a method of designing ICs according to example embodiments of the inventive concepts. For example, the computer-readable storage medium 500 may store the position and wiring program 510 that includes arbitrary commands for executing all or a portion of methods described with reference to the drawings above. The library 520 may include information about a standard cell that is a unit included in the IC.

The analyzing program 530 may include a plurality of commands for executing a method of analyzing the IC based on data defining the IC. The data structure 540 may include storage spaces for managing data generated during processes of using a standard cell library in the library 520, extracting marker information from a general standard cell library in the library 520, or analyzing the timing characteristics of the IC performed by the analyzing program 530.

Figure 24:
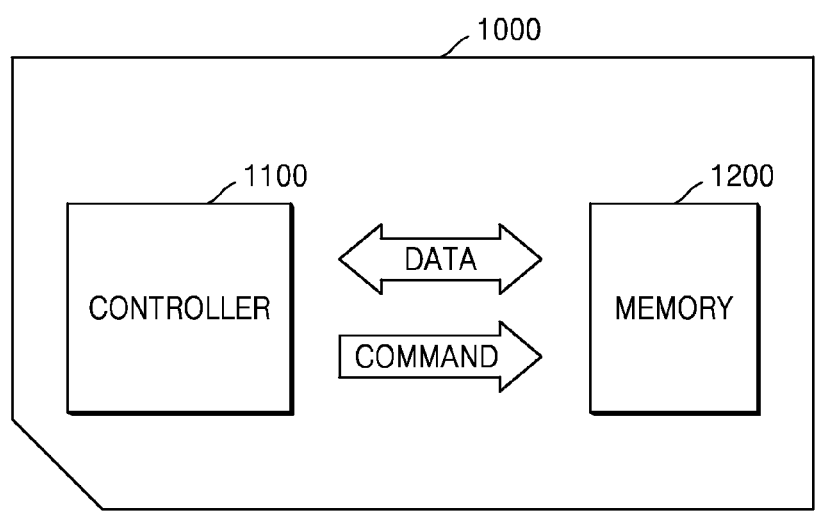
FIG. 24 is a block diagram illustrating a memory card including an IC according to an example embodiment.

FIG. 24 is a block diagram illustrating a memory card 1000 including an IC according to some example embodiments.

Referring to FIG. 24, in the memory card 1000, a controller 1100 and a memory 1200 may be disposed to exchange electric signals, for example, via a bus. For example, when the controller 1100 commands, the memory 1200 may transmit data.

The controller 1100 and the memory 1200 may include an IC according to example embodiments of the inventive concepts. Specifically, in at least one semiconductor device from among a plurality of semiconductor devices in the controller 1100 and the memory 1200, at least one conductive line may be skipped by forming a single node. The single node may be formed by electrically connecting at least two first contacts that extend in the first direction (e.g., the Y direction), a second contact that extends in the second direction (e.g., the X direction) that is perpendicular to the first direction, and at least one conductive lines that extend in the first direction.

The memory card 1000 may be one selected from various types of memory cards, for example, a memory stick card, a smart media (SM) card, a secure digital (SD) card, a mini SD card, and a multimedia card (MMC).

Figure 25:
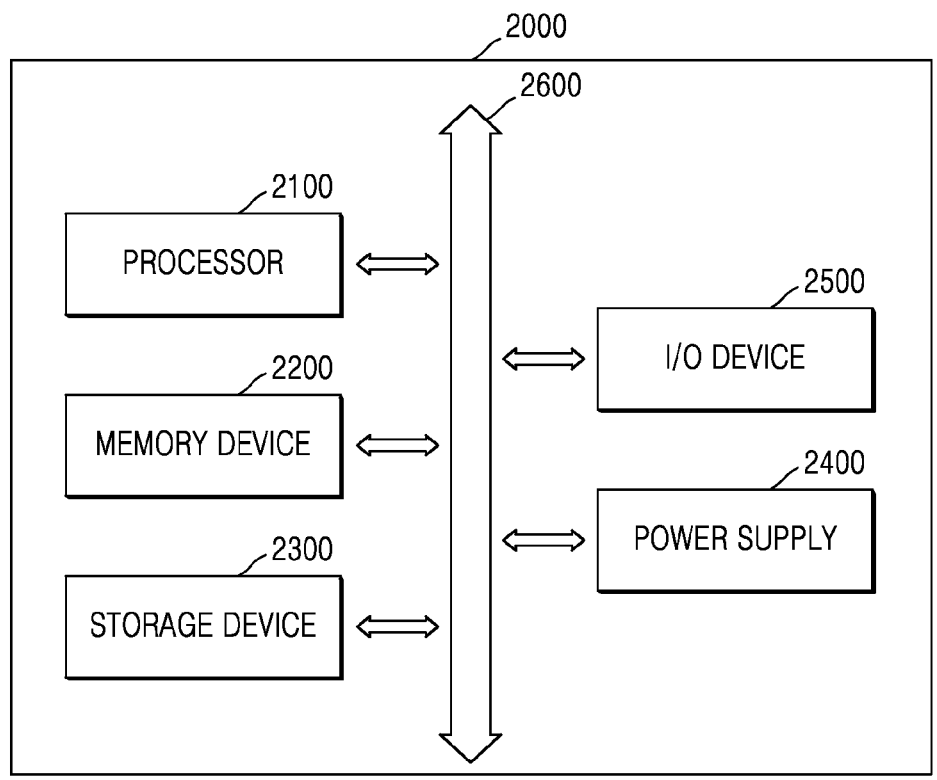
FIG. 25 is a block diagram illustrating a computing system including an IC according to an example embodiment.

FIG. 25 is a block diagram illustrating a computing system 2000 including an IC according to some example embodiments.

Referring to FIG. 25, the computing system 2000 may include a processor 2100, a memory device 2200, a storage device 2300, a power supply 2400, and an input/output (I/O) device 2500. Although not illustrated in FIG. 25, the computing system 2000 may additionally include ports for communicating with video cards, sound cards, memory cards, USB devices, or other electronic devices.

The processor 2100, the memory device 2200, the storage device 2300, the power supply 2400, and the I/O device 2500 included in the computing system 2000 may include an IC according to example embodiments of the inventive concepts. Specifically, in at least one semiconductor device from among a plurality of semiconductor devices in the processor 2100, the memory device 2200, the storage device 2300, the power supply 2400, and the I/O device 2500, at least one conductive line may be skipped by forming a single node. The single node may be formed by electrically connecting at least two first contacts that extend in the first direction (e.g., the Y direction), a second contact that extends in the second direction (e.g., the X direction) that is perpendicular to the first direction, and at least one conductive lines that extend in the first direction.

The processor 2100 may execute desired (or, alternatively, predetermined) computations or tasks. According to example embodiments, the processor 2100 may be a microprocessor) or a central processing unit (CPU). The processor 2100 may communicate with the memory device 2200, the storage device 2300, and the I/O device 2500 via a bus 2600 such as an address bus, a control bus, and a data bus. According to some example embodiments, the processor 2100 may be connected to an expansion bus such as a peripheral component interconnect (PCI) bus.

The memory device 2200 may store data necessary for operations of the computing system 2000. For example, the memory device 2200 may be a dynamic random access memory (DRAM), a mobile DRAM, a static RAM (SRAM), a phase-change RAM (PRAM), a ferroelectric RAM (FRAM), a resistive RAM (RRAM), and/or a magnetoresistive RAM (MRAM). The storage device 2300 may include a solid state drive (SSD), a hard disk drive (HDD), and a CD-ROM.

The I/O device 2500 may include an input device such as a keyboard, a keypad, and a mouse, and an output device such as a printer and a display. The power supply 2400 may provide operation voltages required for the operations of the computing system 2000.

The IC according to example embodiments may be assembled into various types of packages. For example, at least some components of the IC may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While example embodiments of the inventive concepts have been particularly shown and described with reference to some example embodiments thereof, it will be understood that various changes in form and details may be made therein without departing from the spirit and scope of the following claims.

What is claimed is:

1. An integrated circuit (IC) comprising:
at least one cell including,
a plurality of conductive lines that extend in a first direction and are in parallel to each other in a second direction, the second direction being perpendicular to the first direction;
first contacts including a first left contact between a first conductive line and a second conductive line of the plurality of conductive lines; and
a second contact on the second conductive line and the first contacts, the second contact electrically connected to the second conductive line and the first contacts and electrically isolated from the first conductive line such that the second contact, the second conductive line, and the first contacts form a single node.

2. The IC of claim 1, wherein the first contacts extend in the first direction and the second contact extends in the second direction.

3. The IC of claim 1, wherein the second contact extends in a direction perpendicular to the first contacts.

4. The IC of claim 1, wherein each of the at least one cell further comprises:
first and second active regions having different conductive types, and wherein,
the second contact is on at least a selected one of the first and second active regions.

5. The IC of claim 4, wherein
the plurality of conductive lines respectively correspond to a plurality of gate electrodes, and
a number of first transistors in the first active region is less than a number of second transistors in the second active region.

6. The IC of claim 4, wherein
the plurality of conductive lines respectively correspond to a plurality of gate electrodes, and
a number of first transistors in the first active region is equal to or greater than a number of second transistors in the second active region.

7. The IC of claim 4, wherein each of the at least one cell further comprises:
a plurality of fins that extend in the second direction in the first and second active regions, the plurality of fins being in parallel to each other in the first direction.

8. The IC of claim 7, wherein
the plurality of conductive lines respectively correspond to a plurality of gate electrodes,
the plurality of fins respectfully correspond to a plurality of fin transistors, and
a first number of the plurality of fin transistors in the first active region is less than a second number of the plurality of fin transistors in the second active region.

9. The IC of claim 7, wherein
the plurality of conductive lines respectively correspond to a plurality of gate electrodes,
the plurality of fins respectfully correspond to a plurality of fm transistors, and
a first number of the plurality of fin transistors in the first active region is equal to or greater than a second number of the plurality of fin transistors in the second active region.

10. The IC of claim 4, further comprising:
a cutting region between the first and second active regions, the cutting region configured to insulate the first conductive line from the single node in the second active region.

11. The IC of claim 1, wherein
the first contacts includes the first left contact and a first right contact, the first left contact at a second side of the first conductive line, and the first right contact at a second side of the second conductive line.

12. The IC of claim 11, wherein the second contact is on and electrically connected to the first left contact, the first right contact, and the second conductive line and a third conductive line of the plurality of conductive lines.

13. The IC of claim 11, wherein the first contacts further comprise:
a first central contact between the second conductive line and the third conductive line.

14. The IC of claim 13, wherein the second contact is on and electrically connected to the first left contact, the first right contact, the first central contact, the second conductive line, and the third conductive line.

15. The IC of claim 1, wherein
the plurality of conductive lines include the first conductive line, the second conductive line and a third conductive line adjacent to each other,
the first contacts include the first left contact and a first right contact, the first left contact is between the first conductive line and the second conductive line, and the first right contact is between the second conductive line and the third conductive line, and
a length of the second contact in the second direction is greater than a distance between the first left contact and the first right contact and less than a distance between the first conductive line and the third conductive line.

16. The IC of claim 1, wherein respective lengths of the first contacts in the second direction are smaller than a space between two adjacent conductive lines from among the plurality of conductive lines.

17. The IC of claim 1, wherein
the first contacts have the same length in the first direction, and
the first contacts and the second contact form an H-shaped jumper.

18. The IC of claim 1, wherein
the first contacts have different lengths in the first direction, and
the first contacts and the second contact form an L-shaped jumper.

19. A semiconductor device comprising:
a substrate including at least a first active region having a first conductive type;
a plurality of gate electrodes extending in a first direction such that the plurality of gate electrodes are parallel to each other in a second direction, the second direction being perpendicular to the first direction, the plurality of gate electrodes including at least a first gate electrode and a skipped gate electrode;
first contacts at a respective one of two sides of the skipped gate electrode of the plurality of gate electrodes, the skipped gate electrode being one of the plurality of gate electrodes connected to the first contacts; and
a second contact electrically connected to the skipped gate electrode and the first contacts in the first active region and electrically disconnected from the first gate electrode such that the second contact, the skipped gate electrode and the first contacts form a single node in the first active region.

20. The semiconductor device of claim 19, wherein the semiconductor device includes at least one asymmetrical gated integrated circuit (IC), the asymmetrical gated IC including a greater number of transistors in a second active region than in the first active region, the second active region having a second conductive type different from the first conductive type.

21. An integrated circuit (IC) comprising:
at least one cell including,
a plurality of conductive lines that extend in a first direction and are in parallel to each other in a second direction, the second direction being perpendicular to the first direction;
first contacts at a respective one of two sides of at least one conductive line from among the plurality of conductive lines; and
a second contact on the at least one conductive line and the first contacts, the second contact electrically connected to the at least one conductive line and the first contacts such that the second contact, the at least one conductive line, and the first contacts form a single node, wherein
the first contacts have one of (i) a same length in the first direction such that the first contacts and the second contact form an H-shaped jumper and (ii) different lengths in the first direction such that the first contacts and the second contact form an L-shaped jumper.

* * * * *